(12) United States Patent
Jeong et al.

(10) Patent No.: US 7,425,479 B2
(45) Date of Patent: Sep. 16, 2008

(54) METHOD OF MANUFACTURING A THIN FILM TRANSISTOR ARRAY PANEL

(75) Inventors: Soo-Im Jeong, Suwon-si (KR); You-Kyoung Lee, Suwon-si (KR); Jin-Ho Ju, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/777,042

(22) Filed: Jul. 12, 2007

(65) Prior Publication Data

US 2008/0044961 A1 Feb. 21, 2008

Related U.S. Application Data

(62) Division of application No. 10/989,636, filed on Nov. 17, 2004, now abandoned.

(30) Foreign Application Priority Data

Nov. 18, 2003 (KR) ...................... 10-2003-0081538

(51) Int. Cl.
*H01L 21/00* (2006.01)
(52) U.S. Cl. ............... 438/158; 438/780; 257/E21.411; 257/E21.414; 257/E27.111

(58) Field of Classification Search ................ 438/158, 438/780; 257/E21.411, E21.414, E27.111
See application file for complete search history.

(56) References Cited

U.S. PATENT DOCUMENTS

| 6,130,379 A | 10/2000 | Shiotsuka et al. | |
| 6,162,745 A * | 12/2000 | Ito et al. | ..................... 438/795 |
| 2003/0086046 A1 | 5/2003 | You | |

* cited by examiner

*Primary Examiner*—Scott B. Geyer
*Assistant Examiner*—Stanetta D Isaac
(74) *Attorney, Agent, or Firm*—Cantor Colburn LLP

(57) ABSTRACT

The present invention provides a thin film transistor array panel comprising: an insulating substrate; a first signal line formed on the insulating substrate and extending in a first direction; a second signal line formed on the insulating substrate, extending in a second direction, and intersecting the first signal line; a thin film transistor connected to the first and second signal lines; a passivation layer formed on the second signal line and having a contact hole exposing a portion of the second signal line; and a pixel electrode formed on the passivation layer and connected to the thin film transistor through the contact hole, wherein the passivation layer is formed by coating an organic solution that includes an organic insulating material and a solvent including at least one of PGMEP, EEP, and nBA.

8 Claims, 17 Drawing Sheets

SCA 1%

SCA 10%

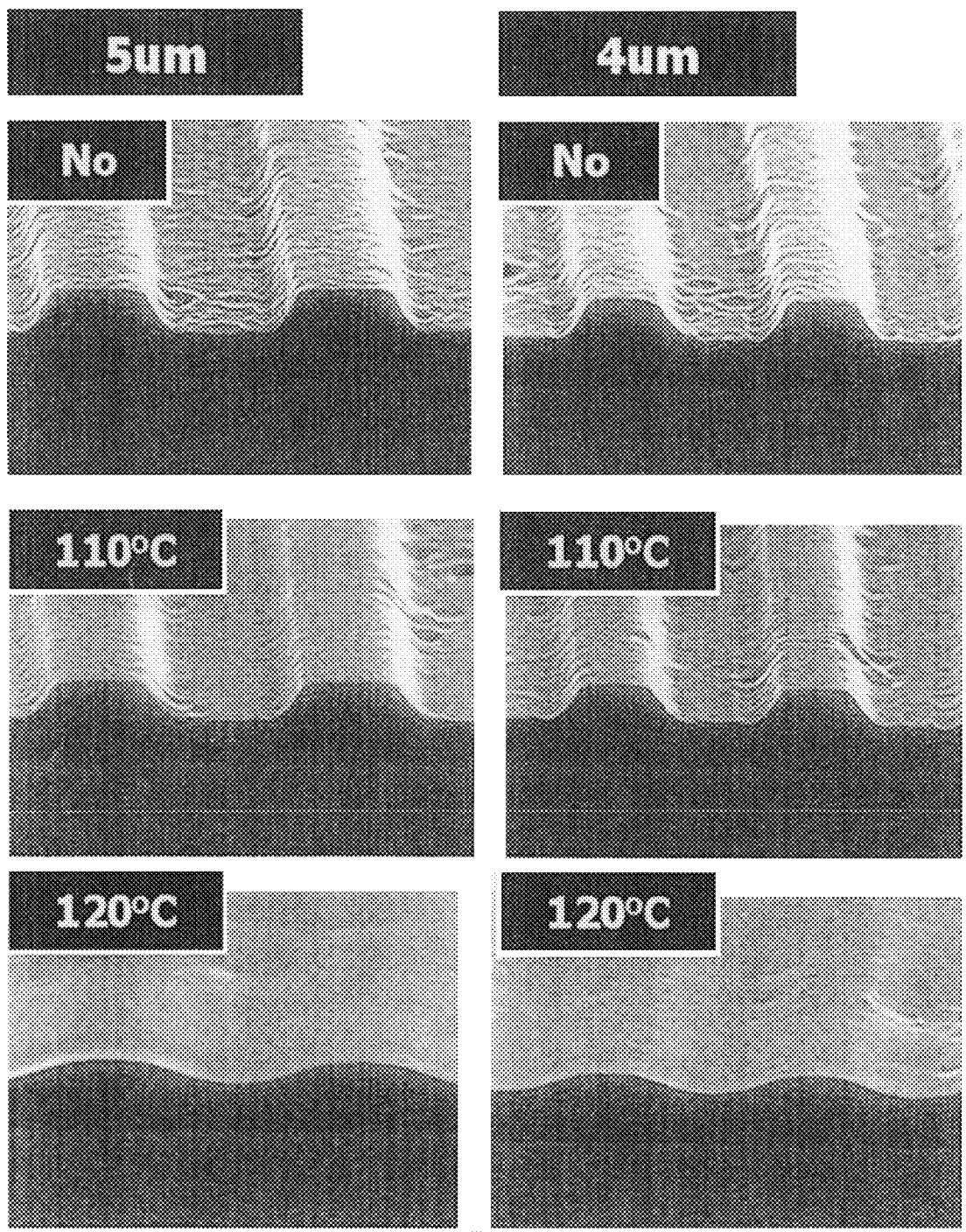

METHOD OF MANUFACTURING A THIN FILM TRANSISTOR ARRAY PANEL

CROSS REFERENCE TO RELATED APPLICATIONS

This application is a division of U.S. application Ser. No. 10/989,636 filed Nov. 17, 2004, which claims priority to Korean Patent Application No. 10-2003-0081538 filed Nov. 17, 2003, the entire contents of which are hereby incorporated by reference.

BACKGROUND OF THE INVENTION (a) Field of the Invention

The present invention relates to a thin film transistor array panel.

(b) Description of the Related Art

An LCD is one of the most popular flat panel displays. Generally, a liquid crystal display has two substrates with electrodes, and a liquid crystal layer sandwiched between the two substrates. Voltages are applied to the electrodes so that the liquid crystal molecules in the liquid crystal layer are re-oriented to thereby control light transmission.

A basic LCD has two substrates respectively having electrodes for producing an electric field. One of the two substrates has a plurality of pixel electrodes arranged in a matrix shape, and the other has a common electrode covering the entire display area of the substrate.

The liquid crystal display has a plurality of pixels with pixel electrodes. The pixels are driven by way of signals applied through the wiring lines. The wiring lines include scanning signal lines or gate lines for carrying scanning signals, and picture signal lines or data lines for carrying the picture signals. Thin film transistors are formed at the respective pixels while each is connected to one gate line and one data line. The picture signals applied to the pixel electrodes are controlled by way of the thin film transistors.

A thin film transistor array panel has a multi-layered structure including gate lines, data lines, and pixel electrodes respectively formed as different layers and insulated by insulating layers.

Here, the data lines and the pixel electrodes are insulated by an organic insulating layer having contact holes for connecting the pixel electrode to drain electrodes. The data lines are formed of a conductive material including molybdenum (Mo) or molybdenum-Tungsten (MOW) for reducing resistance, and the pixel electrodes are formed of a transparent conductive material such as ITO.

However, the Mo-including material and the transparent conductive material have poor adhesiveness with an organic insulating layer. Therefore, the organic insulating layer interposed between the data lines and the pixel electrodes may easily come off therefrom to induce defects such as an open data line and to produce particles. As a result, productivity is degraded.

When the organic material for forming the organic insulating layer is not dissolved by the solvent, the organic insulating layer may have an uneven thickness to induce spots in images.

SUMMARY OF THE INVENTION

The present invention aims at providing an LCD displaying images having fewer spots.

The present invention aims at providing a thin film transistor array panel that does not loose adherence to an organic insulating layer.

The present invention provides a thin film transistor array panel comprising: an insulating substrate; a first signal line formed on the insulating substrate and extending in a first direction; a second signal line formed on the insulating substrate, extending in a second direction, and intersecting the first signal line; a thin film transistor connected to the first and second signal lines; a passivation layer formed on the second signal line and having a contact hole exposing a portion of the second signal line; and a pixel electrode formed on the passivation layer and connected to the thin film transistor through the contact hole, wherein the passivation layer is formed by coating an organic solution that includes an organic insulating material and a solvent including at least one of PGMEP, EEP, and nBA.

The content ratio of PGMEP:EEP:nBA in the solvent is preferably 50 to 90:30 to 5:20 to 5. The organic solution may further include a surfactant comprising at least one of silane F and fluoric S. The content ratio of silane F:fluoric S in the surfactant is preferably 500 to 1500:50 to 500.

The present invention provides a thin film transistor array panel comprising: an insulating substrate; a gate line formed on the insulating; a gate insulating layer formed on the gate line; a semiconductor layer formed on the gate insulating layer; a data line formed on the semiconductor layer; a passivation layer formed on the data line and having a contact hole exposing a portion of the data line; and a pixel electrode formed on the passivation layer and connected to the exposed portion of the data line through the contact hole, wherein the passivation layer is formed by coating an organic solution that include an organic insulating material and a solvent including at least one of PGMEP, EEP, and nBA.

Here, the pixel electrode may include a transparent electrode and a reflection electrode having a transparent window. The passivation layer may have an embossed top surface.

The present invention provides a thin film transistor array panel comprising: an insulating substrate; a polysilicon layer formed on the insulating layer and including a source region, a drain region, and a channel region; a gate insulating layer formed on the polysilicon layer; a gate line formed on the gate insulating layer and including a gate electrode overlapping the channel region; an interlayer insulating layer formed on the gate line; a data line formed on the interlayer insulating layer and including a source electrode connected to the source region; a drain electrode formed on the interlayer insulating layer and connected to the drain region; an organic insulating layer formed on the drain electrode and the data line; and a pixel electrode formed on the organic insulating layer and connected to the drain electrode, wherein the organic insulating layer is formed by coating an organic solution that include an organic insulating material and a solvent including at least one of PGMEP, EEP, and nBA.

The present invention provides a thin film transistor array panel comprising: an insulating substrate; a polysilicon layer formed on the insulating layer and including source regions, drain regions, and channel regions; a gate insulating layer formed on the polysilicon layer; a plurality of gate lines formed on the gate insulating layer and including portions overlapping the channel regions; a plurality of data line segments extending in a longitudinal direction and disposed between two adjacent gate lines; an organic insulating layer formed on the gate lines and the data line segments and having contact holes; a plurality of data connectors formed on the organic insulating layer, intersecting the gate lines, and connected to the data line segments through the contact holes; and a plurality of pixel electrodes formed on the organic insulating layer and connected to the drain regions through the contact holes, wherein the organic insulating layer is formed by coating an organic solution that include an organic insulating material and a solvent including at least one of PGMEP, EEP, and nBA.

The present invention provides a thin film transistor array panel comprising: an insulating substrate; a gate line formed on the insulating substrate; a gate insulating layer formed on the gate line; a semiconductor layer formed on the gate insulating layer; a data line formed on the semiconductor layer; a passivation layer formed on the data line and having a contact hole exposing a portion of the data line; and a pixel electrode formed on the passivation layer and connected to the exposed portion of the data line through the contact hole, wherein the pixel electrode includes a transparent electrode and a reflection electrode having a transparent window and the passivation layer includes 1% to 10% of a silane coupling agent (SCA) with respect to an amount of resin included in the passivation layer.

Here, the passivation layer has an embossed top surface, and the SCA is represented by the structural formula

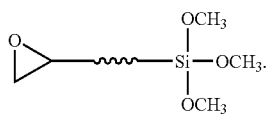

The present invention provides a thin film transistor array panel comprising: an insulating substrate; a gate line formed on the insulating; a gate insulating layer formed on the gate line; a semiconductor layer formed on the gate insulating layer; a data line formed on the semiconductor layer; a passivation layer formed on the data line and having a contact hole exposing a portion of the data line; and a pixel electrode formed on the passivation layer and connected to the exposed portion of the data line through the contact hole, wherein the pixel electrode is a transparent electrode and the passivation layer includes 1% to 10% of a silane coupling agent (SCA) with respect to an amount of resin included in the passivation layer.

The present invention provides a thin film transistor array panel comprising: an insulating substrate; a polysilicon layer formed on the insulating layer and including a source region, a drain region, and a channel region; a gate insulating layer formed on the polysilicon layer; a gate line formed on the gate insulating layer and including a gate electrode overlapping the channel region; an interlayer insulating layer formed on the gate line; a data line formed on the interlayer insulating layer and including a source electrode connected to the source region; a drain electrode formed on the interlayer insulating layer and connected to the drain region; an organic insulating layer formed on the drain electrode and the data line; and a pixel electrode formed on the organic insulating layer and connected to the drain electrode, wherein the pixel electrode includes a transparent electrode and a reflection electrode having a transparent window and the organic insulating layer includes 1% to 10% of a silane coupling agent (SCA) with respect to an amount of resin included in the organic insulating layer.

The present invention provides a thin film transistor array panel comprising: an insulating substrate; a polysilicon layer formed on the insulating layer and including a source region, a drain region, and a channel region; a gate insulating layer formed on the polysilicon layer; a gate line formed on the gate insulating layer and including a gate electrode overlapping the channel region; an interlayer insulating layer formed on the gate line; a data line formed on the interlayer insulating layer and including a source electrode connected to the source region; a drain electrode formed on the interlayer insulating layer and connected to the drain region; an organic insulating layer formed on the drain electrode and the data line; and a pixel electrode formed on the organic insulating layer and connected to the drain electrode, wherein the pixel electrode is a transparent electrode and the organic insulating layer includes 1% to 30% of a silane coupling agent (SCA) with respect to an amount of resin included in the organic insulating layer.

The present invention provides a thin film transistor array panel comprising: an insulating substrate; a polysilicon layer formed on the insulating layer and including source regions, drain regions, and channel regions; a gate insulating layer formed on the polysilicon layer; a plurality of gate lines formed on the gate insulating layer and including portions overlapping the channel regions; a plurality of data line segments extending in a longitudinal direction and disposed between two adjacent gate lines; an organic insulating layer formed on the gate lines and the data line segments and having contact holes; a plurality of data connectors formed on the organic insulating layer, intersecting the gate lines, and connected to the data line segments through the contact holes; and a plurality of pixel electrodes formed on the organic insulating layer and connected to the drain regions through the contact holes, wherein the organic insulating layer includes a transparent electrode and a reflection electrode having a transparent window and the organic insulating layer includes 1% to 10% of a silane coupling agent (SCA) with respect to an amount of resin included in the organic insulating layer.

The present invention provides a thin film transistor array panel comprising: an insulating substrate; a polysilicon layer formed on the insulating layer and including source regions, drain regions, and channel regions; a gate insulating layer formed on the polysilicon layer; a plurality of gate lines formed on the gate insulating layer and including portions overlapping the channel regions; a plurality of data line segments extending in a longitudinal direction and disposed between two adjacent gate lines; an organic insulating layer formed on the gate lines and the data line segments and having contact holes; a plurality of data connectors formed on the organic insulating layer, intersecting the gate lines, and connected to the data line segments through the contact holes; and a plurality of pixel electrodes formed on the organic insulating layer and connected to the drain regions through the contact holes, wherein the organic insulating layer is a transparent electrode and the organic insulating layer includes 1% to 30% of a silane coupling agent (SCA) with respect to an amount of resin included in the organic insulating layer.

The polysilicon layer further may comprise lightly doped drain regions formed between the source region and the channel region and the drain region and the channel region. The thin film transistor array panel may further comprise a blocking layer formed between the insulating layer and the polysilicon layer.

BRIEF DESCRIPTION OF THE DRAWINGS

The present invention will become more apparent by describing embodiments thereof in detail with reference to the accompanying drawings, in which:

FIGS. 12A to 12C are pictures of edges of organic insulating layers formed according to embodiments of the present invention to compare adhesiveness and strength with respect to heat.

DETAILED DESCRIPTION OF THE PREFERRED EMBODIMENTS

Figure 1:
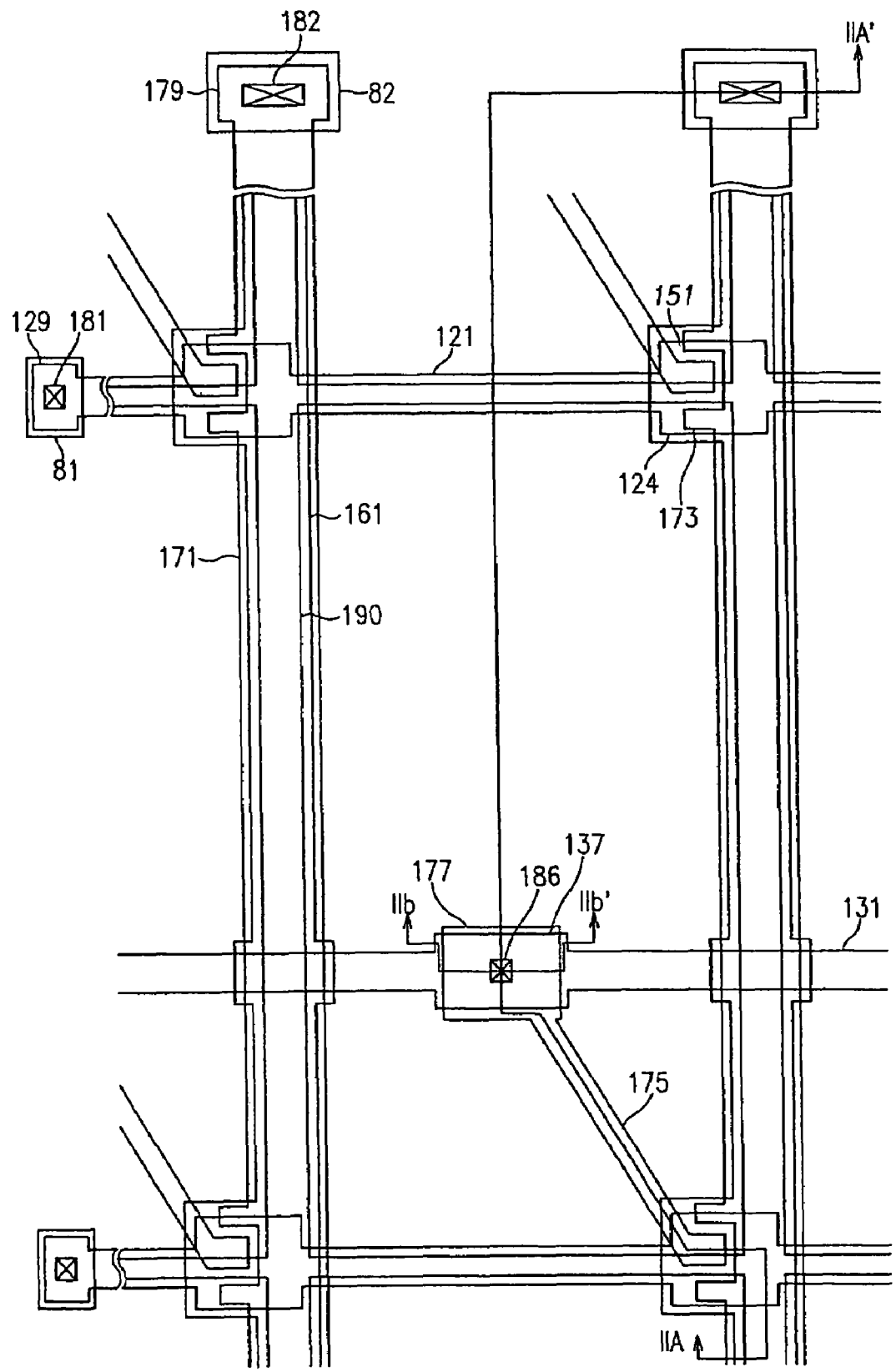
FIG. 1 is a layout view of an LCD according to an embodiment of the present invention.

Preferred embodiments of the present invention now will be described more fully hereinafter with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Figure 2A:
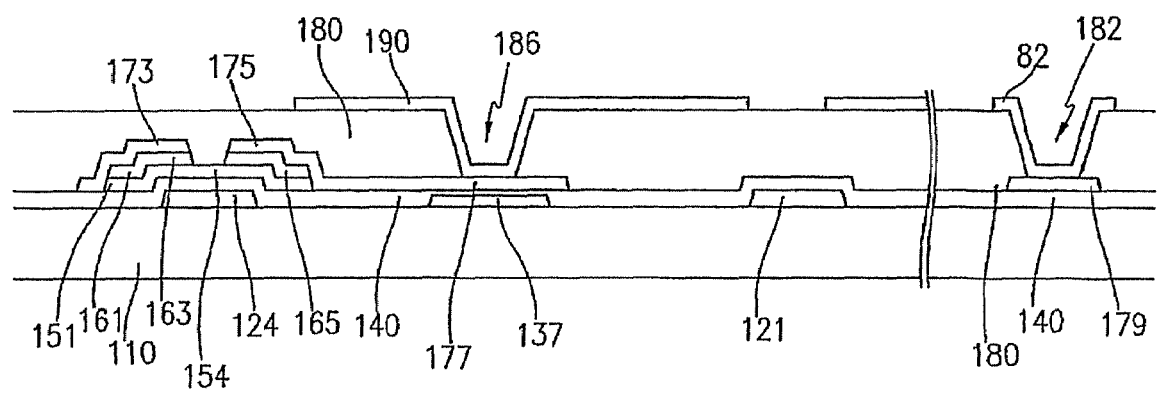
FIGS. 2A and 2B are sectional views of the LCD shown in FIG. 1 respectively taken along the lines IIa-IIa' and IIb-IIb'.
Figure 2B:
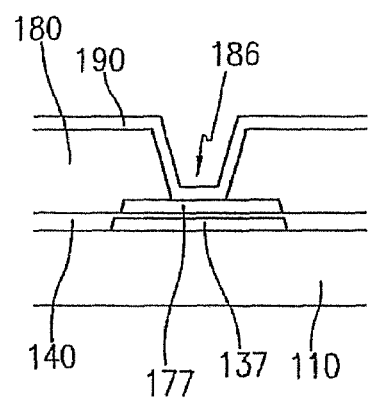

FIG. 1 is a layout view of an LCD according to an embodiment of the present invention; FIGS. 2A and 2B are sectional views of the LCD shown in FIG. 1 respectively taken along the lines IIa-IIa' and IIb-IIb';

As shown in FIGS. 1 to 2B, a plurality of gate lines 121 and a plurality of storage electrode lines 131 are formed on a transparent substrate 110. The gate lines 121 and the storage electrode lines 131 are separated from each other and extend substantially in a transverse direction.

Each gate line 121 includes a plurality of portions projecting upward and downward to form a plurality of gate electrodes 124 and an expansion 129 having a large area for contact with another layer or an external device.

Each storage electrode line 131 is supplied with a predetermined voltage such as a common voltage, and it includes a plurality of expansions 137 protruding upward and downward.

The gate lines 121 and the storage electrode lines 131 may be made of an Al-containing metal such as Al and an Al alloy, an Ag-containing metal such as Ag and an Ag alloy, is a Cu-containing metal such as Cu and a Cu alloy, a Mo-containing metal such as Mo and a Mo alloy, Cr, Ti, or Ta. The gate lines 121 and the storage electrode lines 131 may have a multilayered structure including two films having different physical characteristics. One of the films is preferably made of low resistivity metal including an Al-containing metal for reducing signal delay or voltage drop in the gate lines 121, while the other film is preferably made of a material such as Cr, Mo, a Mo alloy such as MoW, Ta, and Ti, which have good physical, chemical, and electrical contact characteristics with other materials such as indium tin oxide (ITO) and indium zinc oxide (IZO). Good examples of combinations of the lower film material and the upper film material are a lower Cr film and an upper Al (or Al—Nd) film, and a lower Al (or Al—Nd) film and an upper Mo film.

The lateral sides of the gate lines 121 and the storage electrode lines 131 are inclined relative to a surface of the substrate 110, and the inclination angle thereof ranges from about 30-80 degrees.

A gate insulating layer 140 preferably made of silicon nitride (SiNx) is formed on the gate lines 121 and storage electrode lines 131.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124.

A plurality of ohmic contact stripes and islands 161 and 165 preferably made of silicide or n+ hydrogenated a-Si heavily doped with n-type impurities are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contact stripes and islands 161 and 165 are inclined relative to a surface of the substrate 110, and the inclination angles thereof are preferably in a range of about 30-80 degrees.

A plurality of data lines 171 and a plurality of drain electrodes 175 are formed on the ohmic contact stripes and islands 161 and 165 and the gate insulating layer 140.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each drain electrode 175 includes one linear end portion disposed on a gate electrode 124 and partially enclosed by a source electrode 173 and the other expanded end portion 177 having a large area for contact with another layer and overlapping an expansion 137 of a storage electrode line 131. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 may be made of a refractory metal such as Cr, a Mo-containing metal, Ti, or Ta. However, they may also include a low resistivity film and a good contact film. Like the gate lines 121, the data lines 171 and the drain electrodes 175 have tapered lateral sides relative to the surface of the substrate 110, and the inclination angles thereof range from about 30-80 degrees.

A passivation layer 180 made of an organic insulating material is formed on the data lines 171 and the drain electrodes 175, and on exposed portions of the semiconductor stripes 151 that are not covered with the data lines 171 and the drain electrodes 175.

The passivation layer 180 has a plurality of contact holes 182 and 186 exposing the end portions 179 of the data lines 171 and the drain electrodes 175, respectively.

The passivation layer 180 is formed by spin coating of an organic solution comprising a solvent and an organic material dissolved by the solvent. Here, when the organic material for forming the passivation layer 180 is not dissolved by the solvent, the passivation layer 180 may have an uneven thickness which can induce spots in images.

To solve such a problem, a solvent and a surfactant for helping the spread of the organic solution are used.

Conventionally, PGMEP (propylene glycol methyl ethyl propionate) is solely used as a solvent. However, in an embodiment of the present invention, PGMEP, EEP (ethoxy ethyl propionate), and nBA (n-butylacetate) are used together to enhance spread of the organic solution to form a passivation layer 180 having an improved uniformity of thickness.

Table 1 shows surface tension of the organic solution with respect to its solvents. The solvents have different content ratio of PGMEP, EEP, nBA, and nPAC (n-propylacetate), as shown.

TABLE 1

| PGMEP | EEP | nBA | nPAC | surface tension |
|---|---|---|---|---|
| 70 | 25 | 5 | 0 | 27.0 |
| 70 | 25 | 0 | 5 | 27.7 |
| 70 | 30 | 0 | 0 | 27.6 |
| 80 | 15 | 5 | 0 | 27.1 |
| 80 | 15 | 0 | 5 | 27.7 |
| 80 | 20 | 0 | 0 | 27.2 |
| 90 | 10 | 0 | 0 | 28.0 |
| 95 | 0 | 5 | 0 | 27.6 |
| 95 | 0 | 0 | 5 | 27.9 |

As shown in Table 1, it is preferable that the content ratio of PGMEP:EEP:nBA in the solvent is 50 to 90:30 to 5:20 to 5 to reduce surface tension of the organic solution. When the content ratio of PGMEP:EEP:nBA in the solvent is 70:25:5, the organic solution has the lowest surface tension.

When the organic solution has a low surface tension, fluidity of the organic solution is good which facilitates a high spread speed and thickness uniformity.

FIGS. 3A to 3H are pictures of edges and a corner of an organic insulating layer coated on a substrate.

Figure 3A:
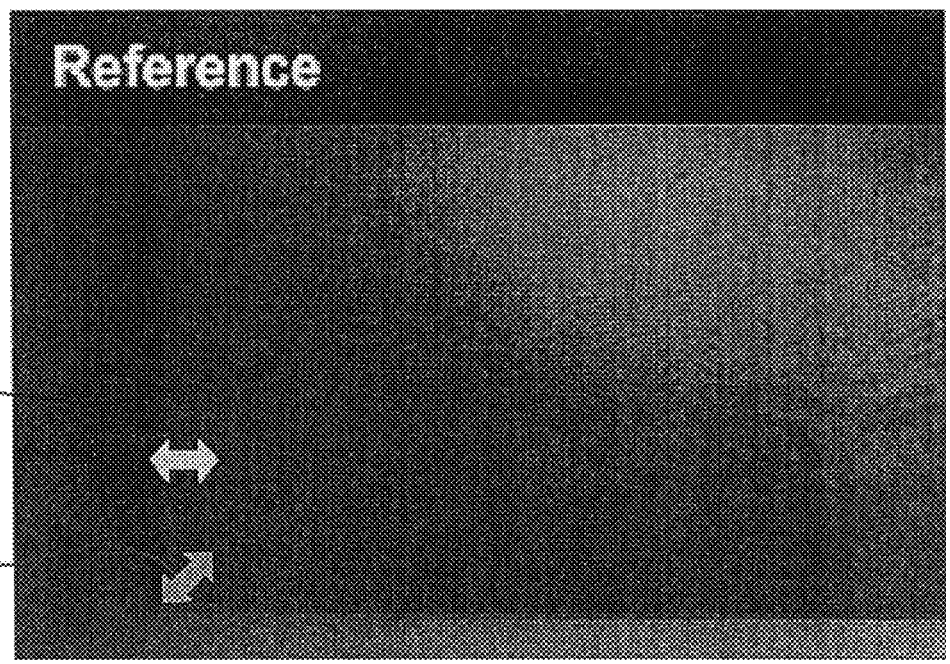
FIGS. 3A to 3H are pictures of edges and a corner of an organic insulating layer coated on a substrate.
Figure 3B:
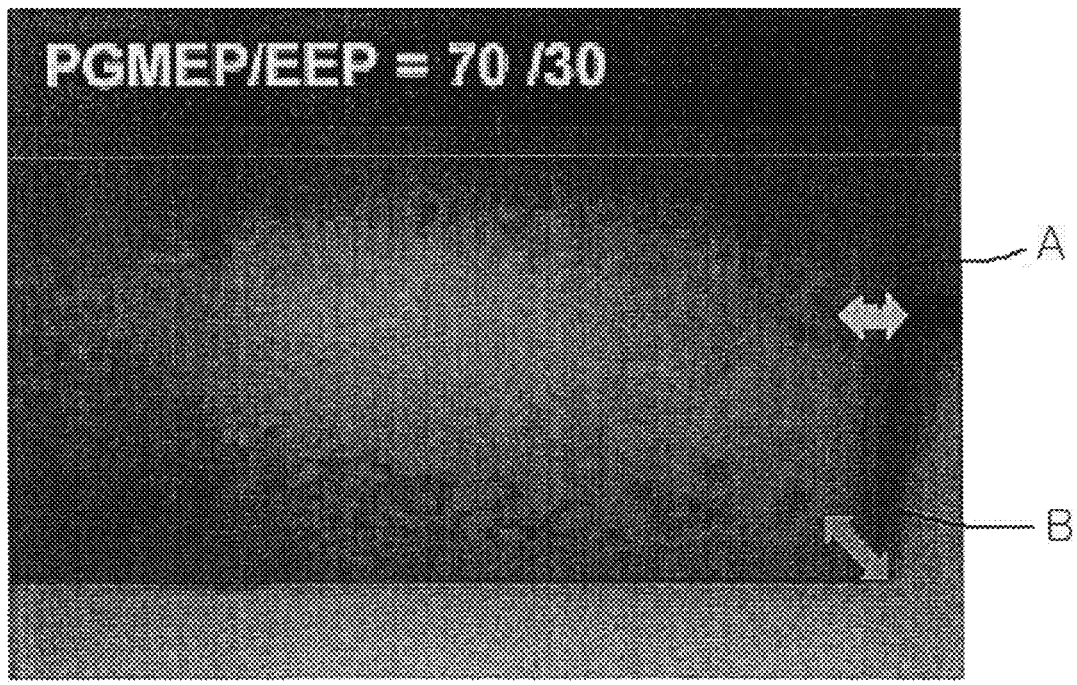
Figure 3C:
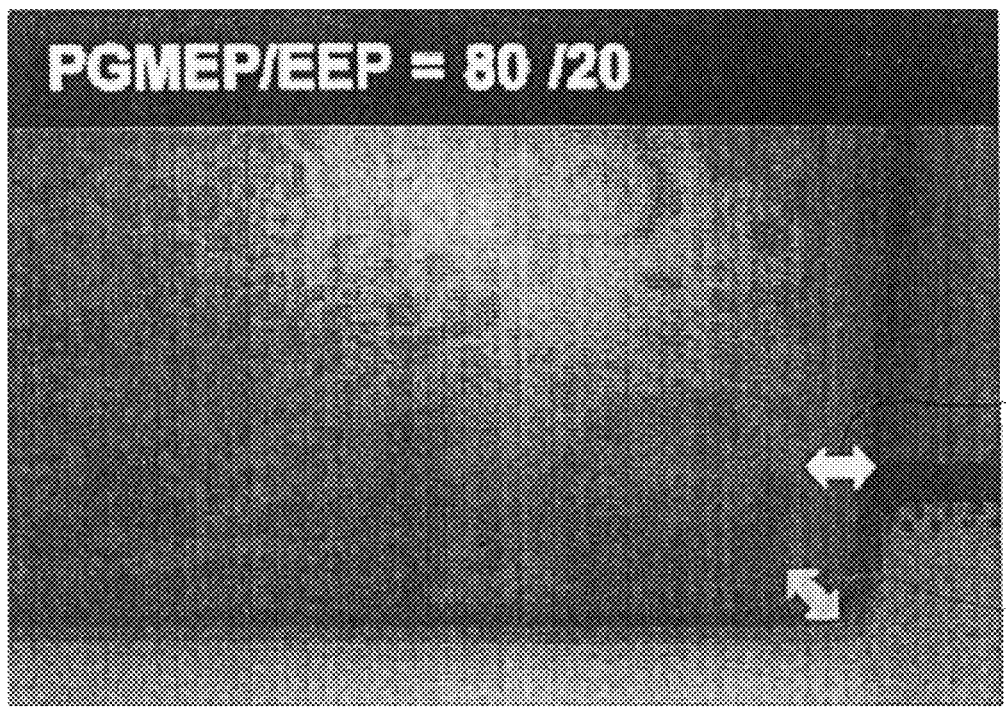
Figure 3D:
Figure 3E:
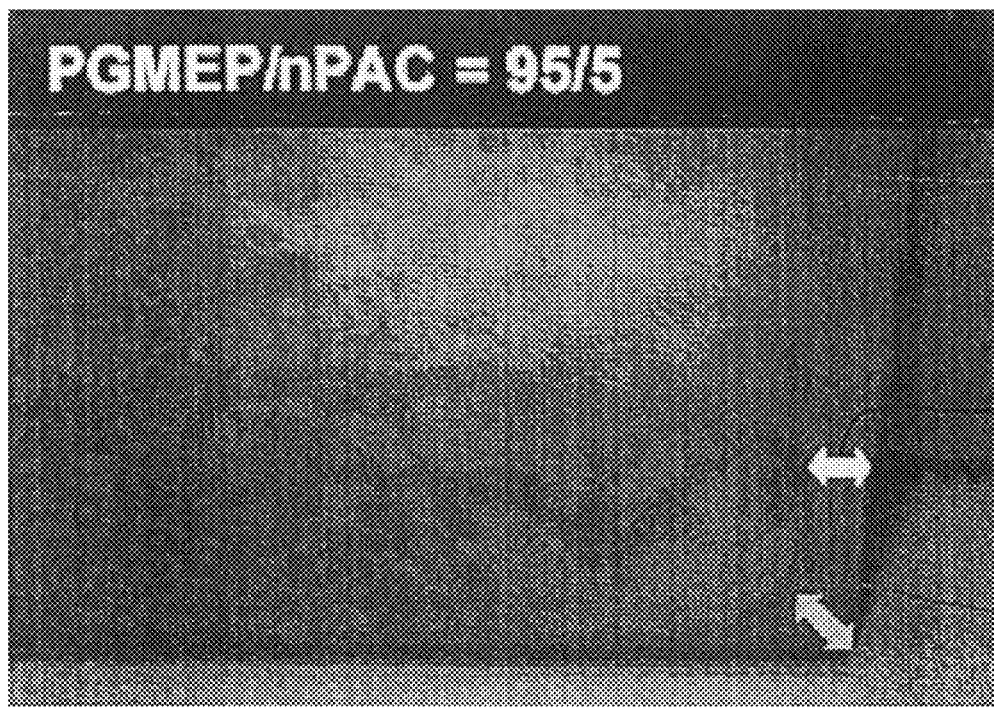
Figure 3F:
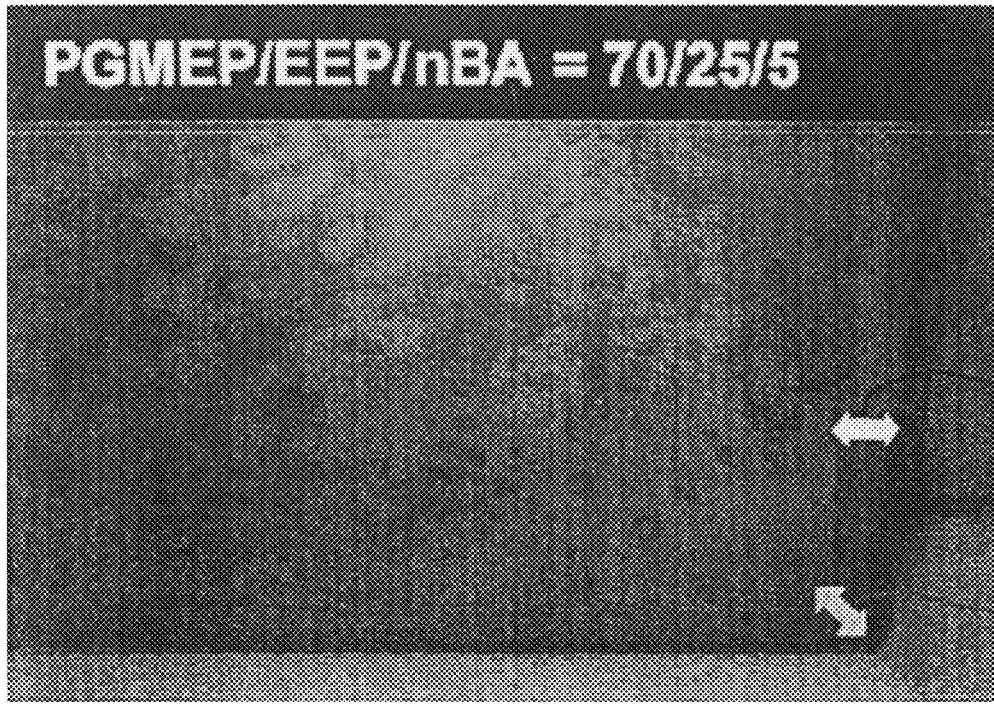
Figure 3G:
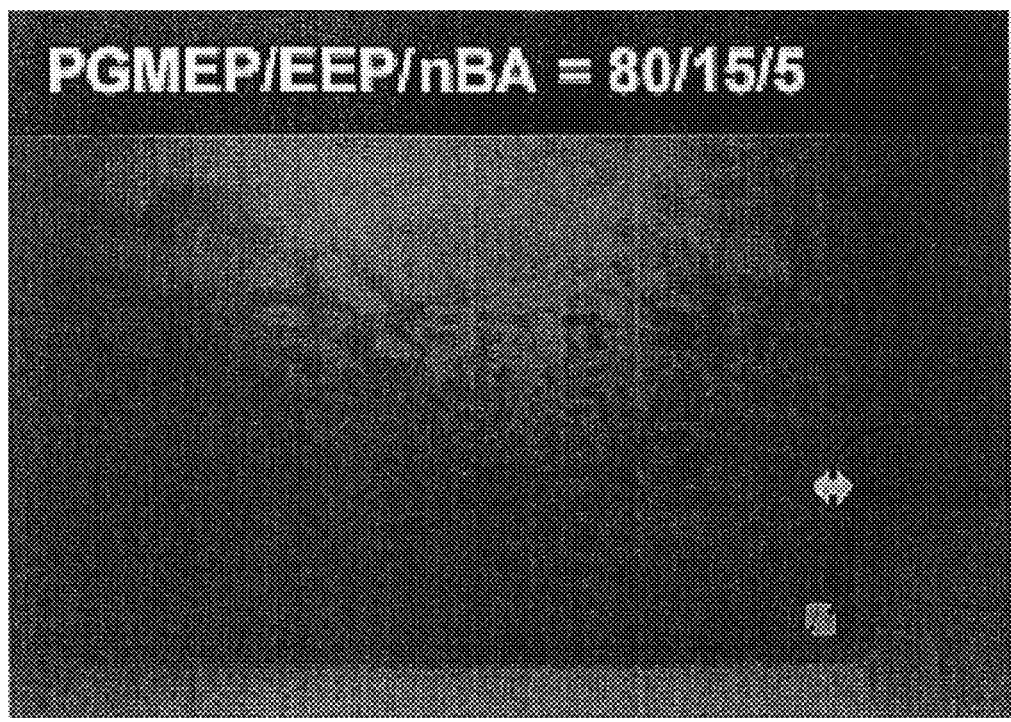
Figure 3H:
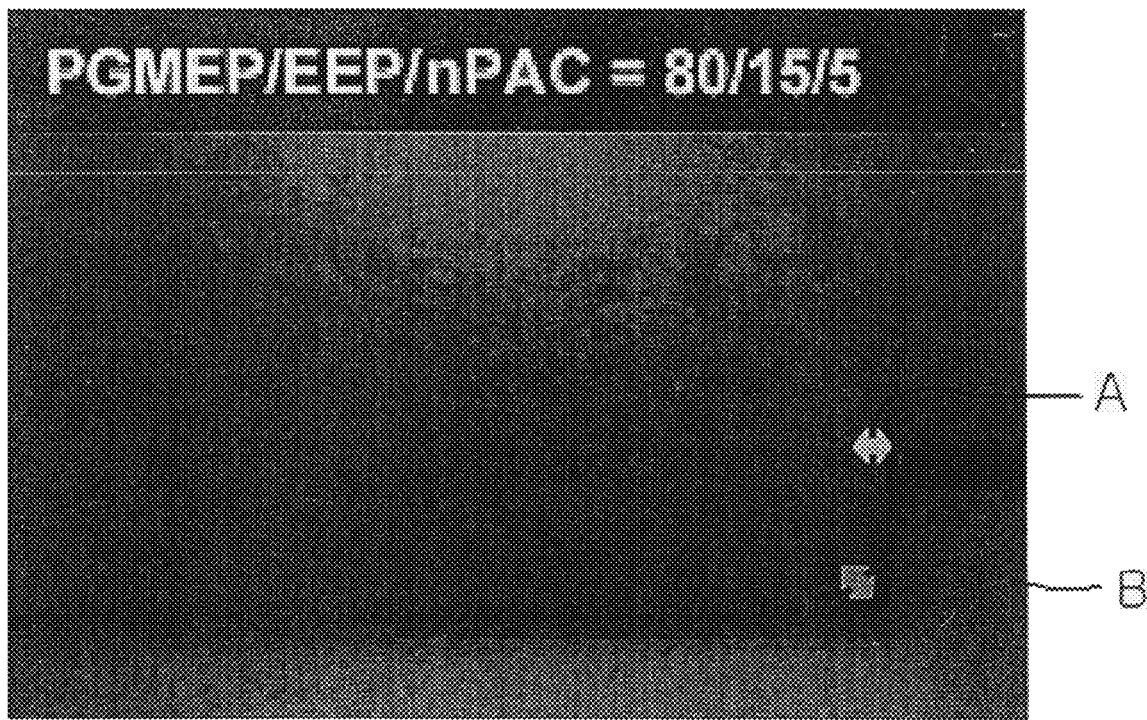

FIG. 3A shows an organic insulating layer formed by using a solvent of DMEE (diethylene glycol methyl ethyl ether). FIG. 3B shows an organic insulating layer formed by using a solvent comprising 70% of PGMEP and 30% of EEP. FIG. 3C shows an organic insulating layer formed by using a solvent comprising 80% of PGMEP and 20% of EEP. FIG. 3d shows an organic insulating layer formed by using a solvent comprising 95% of PGMEP and 5% of nBA. FIG. 3E shows an organic insulating layer formed by using a solvent comprising 95% of PGMEP and 5% of nPAC. FIG. 3F shows an organic insulating layer formed by using a solvent comprising 70% of PGMEP, 25% of EEP, and 5% of nBA. FIG. 3G shows an organic insulating layer formed by using a solvent comprising 80% of PGMEP, 15% of EEP, and 5% of nBA. FIG. 3H shows an organic insulating layer formed by using a solvent comprising 80% of PGMEP, 15% of EEP, and 5% of nPAC.

In FIGS. 3A to 3H, "A" represents distance from the edge of the base substrate to the organic insulating layer, and "B" represents distance from the corner of the base substrate to the organic insulating layer.

As shown in FIGS. 3B and 3C, as the content ratio of EEP increases, the distance from the edge of the base substrate to the organic insulating layer increases, and the distance from the corner of the base substrate to the organic insulating layer increases.

As shown in FIGS. 3C and 3G, as the content ratio of nBA increases, the distance from the edge of the base substrate to the organic insulating layer decreases and the distance from the corner of the base substrate to the organic insulating layer decreases.

Referring to FIGS. 3G and 3H, the uniformity of distance from the edge of the base substrate to the organic insulating layer and the distance from the corner of the base substrate is better when the solvent includes nBA than when it includes NPAC.

Referring to FIG. 3F, the solvent comprising 70% of PGMEP, 25% of EEP, and 5% of nBA is the best for fluidity of the organic solution for uniform coating.

Meanwhile, an organic insulating layer is more uniformly formed when the organic solution includes a solvent and a surfactant.

The surfactant decreases surface tension, but produces micro bubbles which have to be removed. It takes time to remove the micro bubbles, so a condition acceptable in view of both decreasing surface tension and taking less time to remove the micro bubbles must be found.

Table 2 shows surface tensions and times to remove the micro bubbles with respect to included surfactant and its amount. There are three types of surfactant, which are silane F, fluoric S, and silane R.

TABLE 2

| silane F | silane R | fluoric S | Surface tension (degree) | Time to remove micro bubbles |
|---|---|---|---|---|
| 3000 | 0 | 0 | 26 | 3'43" |
| 2000 | 200 | 0 | 26.2 | 3'12" |
| 1500 | 150 | 0 | 27.5 | 2'28" |
| 1500 | 0 | 150 | 27 | 2'03" |
| 0 | 200 | 0 | 27.1 | 2'10" |

Referring to Table 2, when the solution includes 1,500 ppm of silane F and 150 ppm of fluoric S, it takes the shortest time to remove micro bubbles.

Accordingly, at least one of the silane F and the fluoric S is included in the organic solution. It is preferable that the content ratio of the silane F versus the fluoric S is 500 to 1500:50 to 500.

It is especially preferable that the content of the silane F is 1,500 ppm and that of the fluoric S is 500 ppm.

It is preferable that the solvent and the surfactant are used together. However, the solvent may be used without the surfactant.

A plurality of pixel electrodes 190 and a plurality of contact assistants 82, which are made of a transparent conductive material such as ITO and IZO, are formed on the passivation layer 180.

A thin film transistor having transparent pixel electrodes is used for a transparent is LCD.

The pixel electrodes 190 are physically and electrically connected to the drain electrodes 175 through the contact holes 186 such that the pixel electrodes 190 receive the data voltages from the drain electrodes 175.

The pixel electrodes 190 supplied with the data voltages generate electric fields in cooperation with a common electrode on the upper panel (not illustrated), which reorient liquid crystal molecules in a liquid crystal layer (not illustrated) disposed therebetween.

The pixel electrode 190 and the common electrode form a liquid crystal capacitor to preserve applied voltage after turning off the thin film transistor. A storage capacitor connected to the liquid crystal capacitor in parallel is formed to enhance the capability of preserving a pixel voltage. The storage capacitor may be formed by overlapping of the pixel electrode 190 and the storage electrode line 131 or by overlapping of the pixel electrode 190 and a previous gate line.

To increase storage capacitance, the storage electrode line 131 has expansions 137 to increase the overlapping area, and the expansion 177 of the drain electrode 175 is disposed to overlap the expansion 137 of the storage electrode line 131 to decrease the distance between the two electrodes forming the storage capacitor.

The contact assistants 82 are connected to the exposed expansions 179 of the data lines 171 through the contact holes 182. The contact assistants 82 protect the exposed portions 179 and complement the adhesion between the exposed portions 179 and external devices, and they may be omitted.

The gate line 121 includes an expansion 129 having a larger area for contact with another layer or an external device.

The passivation layer 180 has a plurality of contact holes 181 exposing the expansions 129 of the gate lines 121.

A plurality of contact assistants 81, which are made of a transparent conductive material such as ITO and IZO, are formed on the passivation layer 180 to be connected with the expansions 129 of the gate lines 121 through the contact holes 181.

Such contact assistants 81 are needed when the gate driving circuit is installed on the thin film transistor array panel or on the flexible printed circuit as a chip. However, when the gate driving circuit is directly fabricated on the thin film transistor array panel, the contact assistants 81 and the contact holes may be omitted.

The organic insulating layer according to the present invention may be applied to a trans-reflective liquid crystal display having reflection electrodes as well as transparent electrodes.

The trans-reflective liquid crystal display has reflection electrodes having transparent windows, transparent electrodes, and an organic insulating layer formed under the reflection electrodes and having an embossed surface. The embossed surface improves direction randomness of reflected light at the reflection electrode.

Even though the organic insulating layer is applied to the trans-reflective liquid crystal display, it is preferable that the content ratio of PGMEP:EEP:nBA in the solvent is 50 to 90:30 to 5:20 to 5 to reduce surface tension of the organic solution. When the content ratio of PGMEP:EEP:nBA in the solvent is 70:25:5, the organic solution has the lowest surface tension.

When the organic solution has a low surface tension, fluidity of the organic solution is good which facilitates a high spread speed and thickness uniformity.

Meanwhile, an organic insulating layer is more uniformly formed when the organic solution includes a solvent and a surfactant.

The surfactant decreases surface tension, but produces micro bubbles which have to be removed. It takes time to remove the micro bubbles, so a condition acceptable in view of both decreasing surface tension and talking less time to remove the micro bubbles must be found.

Accordingly, at least one of the silane F and the fluoric S is included in the organic solution. It is preferable that the content ratio of the silane F versus the fluoric S is 500 to 1500:50 to 500 to reduce surface tension and to diminish time for removing micro bubbles.

The organic insulating layer according to the present invention may be applied to a polysilicon thin film transistor array panel.

Henceforth, a thin film transistor array panel of polysilicon according to another embodiment of the present invention will be described.

Figure 4:
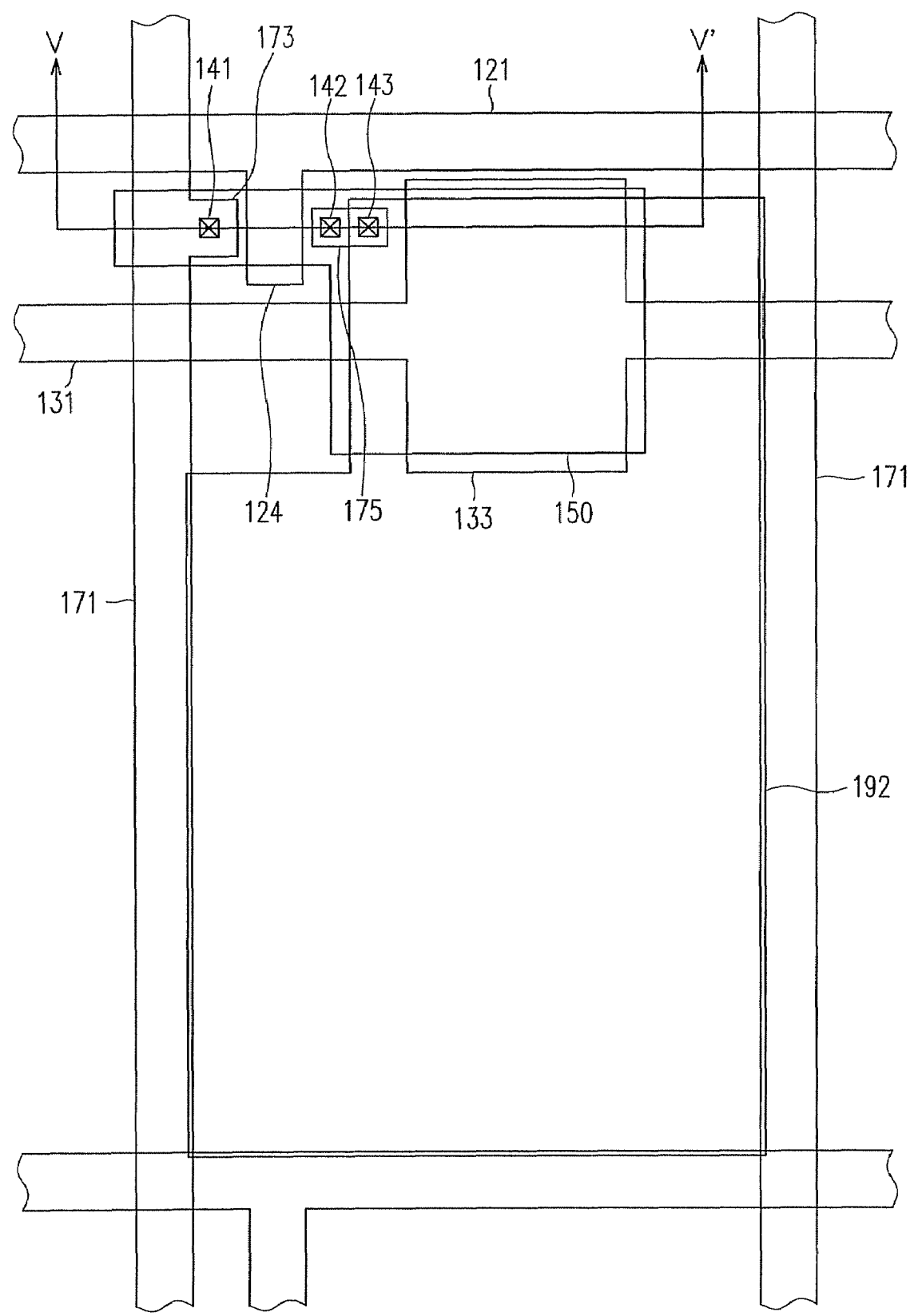
FIG. 4 is a layout view of an LCD according to another embodiment of the present invention.
Figure 5:
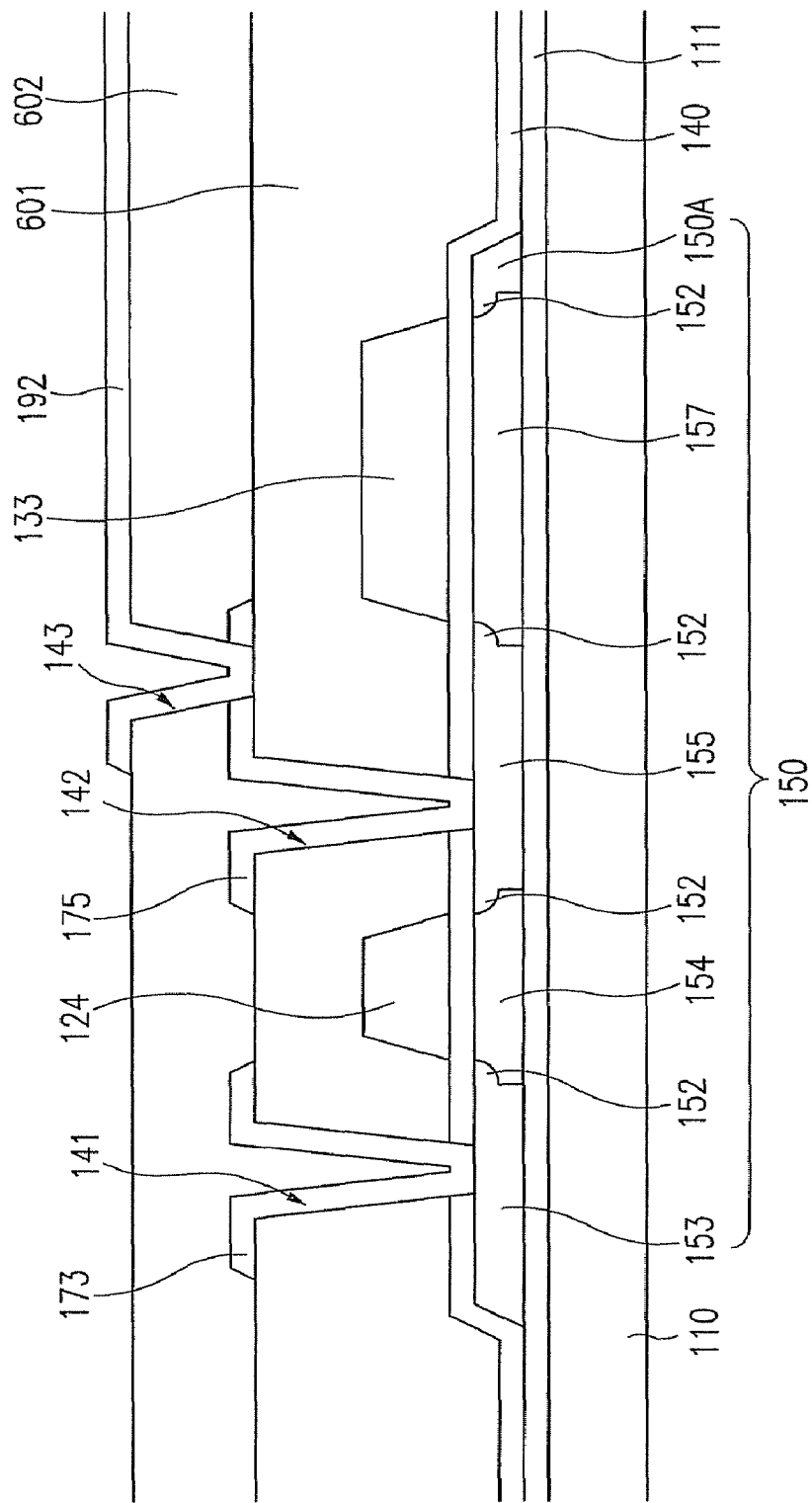
FIG. 5 is a sectional view of the LCD shown in FIG. 4 taken along the line V-V'.

FIG. 4 is a layout view of an LCD according to another embodiment of the present invention. FIG. 5 is a sectional view of the LCD shown in FIG. 4 taken along the line V-V'.

As shown in FIGS. 4 and 5, a blocking film 111 preferably made of silicon oxide ($SiO_2$) or silicon nitride (SiNx) is formed on a transparent insulating substrate 110.

A plurality of semiconductor islands 150, preferably made of polysilicon, are formed on the blocking film 111. Each of the semiconductor islands 150 includes a plurality of extrinsic regions containing conductive impurities, which include a plurality of heavily doped regions and a plurality of lightly doped regions, and a plurality of intrinsic regions hardly containing conductive impurities. The intrinsic regions include a channel region 154 and a storage region 157, and the heavily doped regions include source and drain regions 153 and 155 separated from each other with respect to the channel region 154 and dummy regions 150A. The lightly doped regions 152 are narrow and are disposed between the intrinsic regions 154 and 157 and the heavily doped regions 153, 155, and 150A. In particular, the lightly doped regions 152 disposed between the source region 153 and the channel region 154 and between the drain region 155 and the channel region 154 are referred to as "lightly doped drain (LDD) regions."

The conductive impurities include P type impurities such as boron (B) and gallium (Ga), and N type impurities such as phosphorous (P) and arsenic (As). The lightly doped regions 152 prevent leakage current of TFTs and are substituted with offset regions that contain substantially no impurities.

A gate insulating layer 140, preferably made of silicon nitride (SiNx), is formed on the semiconductor islands 150 and the blocking film 111.

A plurality of gate conductors including a plurality of gate lines 121 and a plurality of storage electrode lines 131 are formed on a transparent insulating substrate 110.

The gate lines 121 for transmitting gate signals extend substantially in a transverse direction, and include a plurality of gate electrodes 124 protruding downward to overlap the channel regions 154 of the semiconductor islands 150. The gate electrodes 124 may further overlap the lightly doped regions 152. Each gate line 121 may include an expanded end portion having a large area for contact with another layer or an external driving circuit. The gate lines 121 may be directly connected to a gate driving circuit for generating the gate signals, which may be integrated on the substrate 110.

The storage electrode lines 131 are supplied with a predetermined voltage such as a common voltage, and include a plurality of storage electrodes 133 protruding upward and downward and overlapping the storage regions 157 of the semiconductor islands 150.

The gate lines 121 and the storage electrode lines 131 may be made of an Al-containing metal such as Al and an Al alloy, an Ag-containing metal such as Ag and an Ag alloy, a Cu-containing metal such as Cu and a Cu alloy, a Mo-containing metal such as Mo and a Mo alloy, Cr, Ti, or Ta. The gate lines 121 and the storage electrode lines 131 may have a multilayered structure including two films having different physical characteristics. One of the films is preferably made of a low resistivity metal including an Al-containing metal for reducing signal delay or voltage drop in the gate lines 121, while the other film is preferably made of a material such as Cr, Mo, a Mo alloy such as MoW, Ta, and Ti, which have good physical, chemical, and electrical contact characteristics with other materials such as indium tin oxide (ITO) and indium zinc oxide (IZO). Good examples of combinations of the lower film material and the upper film material are a lower Cr film and an upper Al (or Al—Nd) film, and a lower Al (or Al—Nd) film and an upper Mo film.

An interlayer insulating layer 601 is formed on the gate lines 121 and the storage electrode lines 131. The interlayer insulating layer 601 is formed of double layers of $SiO_2$ and SiN. The $SiO_2$/SiN double layers improve reliability of a thin film transistor over an $SiO_2$ single layer.

The interlayer insulating layer 601 has a plurality of contact holes 141 and 142 respectively exposing the source regions 153 and the drain regions 155.

A plurality of data conductors including a plurality of data lines 171 and a plurality of drain electrodes 175 are formed on the interlayer insulating layer 601. The data lines 171 for transmitting data voltages extend substantially in the longitudinal direction and intersect the gate lines 121. Each data line 171 includes a plurality of source electrodes 173 connected to the source regions 153 through the contact holes 141. The data lines 171 may have expanded end portions for connection with an external circuit.

The drain electrodes 175 are separated from the source electrodes 173 and are connected to the drain regions 155 through the contact holes 142.

The data lines 171 and the drain electrodes 175 are made of a Mo-containing metal such as MoW that has good chemical and electrical contact characteristics with respect to IZO (indium zinc oxide) and ITO (indium tin oxide). However, they may be made of an Ag-containing metal or an Al-containing metal or may be formed of double layers including a low resistivity film of Ag, Al, and their alloys and a good contact film of Cr, Ti, Ta, Mo, and their alloys.

An organic insulating layer 602 is formed on the data conductors 171 and 175 and the interlayer insulating layer 601.

Here, the organic insulating layer 602 is formed by coating an organic solution including an organic material and its solvent. It is preferable that the content ratio of PGMEP:EEP: nBA in the solvent is 50 to 90:30 to 5:20 to 5 to reduce surface tension of the organic solution. When the content ratio of PGMEP:EEP:nBA in the solvent is 70:25:5, the organic solution has the lowest surface tension.

When the organic solution has a low surface tension, fluidity of the organic solution is good which facilitates a high spread speed and thickness uniformity.

Meanwhile, an organic insulating layer is more uniformly formed when the organic solution includes a solvent and a surfactant.

The surfactant decreases surface tension, but produces micro bubbles which have to be removed. It takes time to remove the micro bubbles, so a condition acceptable in view of both decreasing surface tension and taking less time to remove the micro bubbles must be found.

Accordingly, at least one of the silane F and the fluoric S is included in the organic solution. It is preferable that the content ratio of the silane F versus the fluoric S is 500 to 1500:50 to 500 to reduce surface tension and to diminish time for removing micro bubbles.

The organic insulating layer 602 has a plurality of contact holes 143 to expose the drain electrodes 175.

A plurality of transparent electrodes 192, which are pixel electrodes and are made of ITO, are formed on the organic insulating layer 602.

The organic insulating layer according to the present invention may be applied to a trans-reflective liquid crystal display having reflection electrodes as well as transparent electrodes and polysilicon thin film transistors.

Henceforth, a polysilicon thin film transistor array panel for a trans-reflective LCD according to another embodiment of the present invention will be described.

Figure 6:
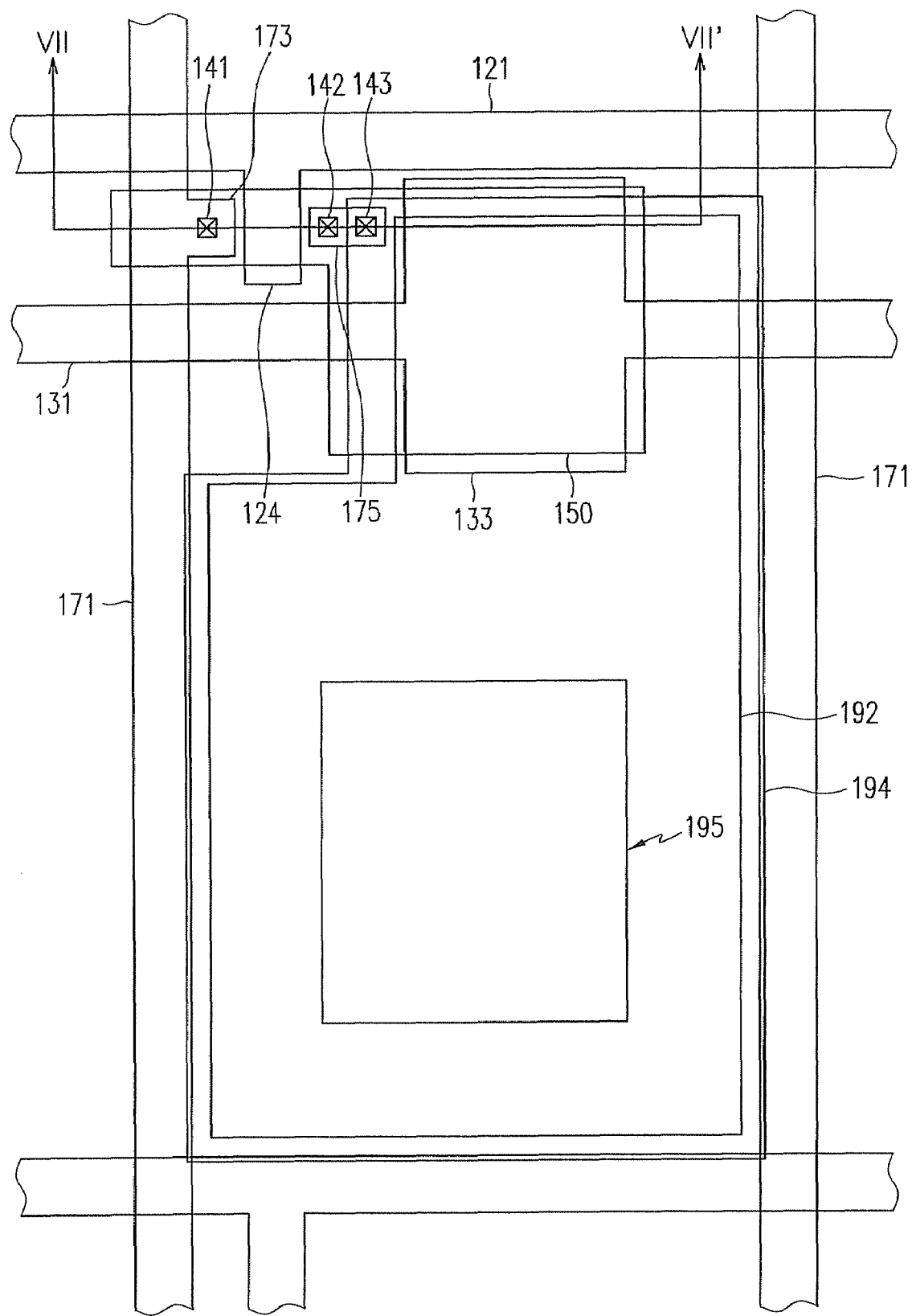
FIG. 6 is a layout view of an LCD according to another embodiment of the present invention.
Figure 7:
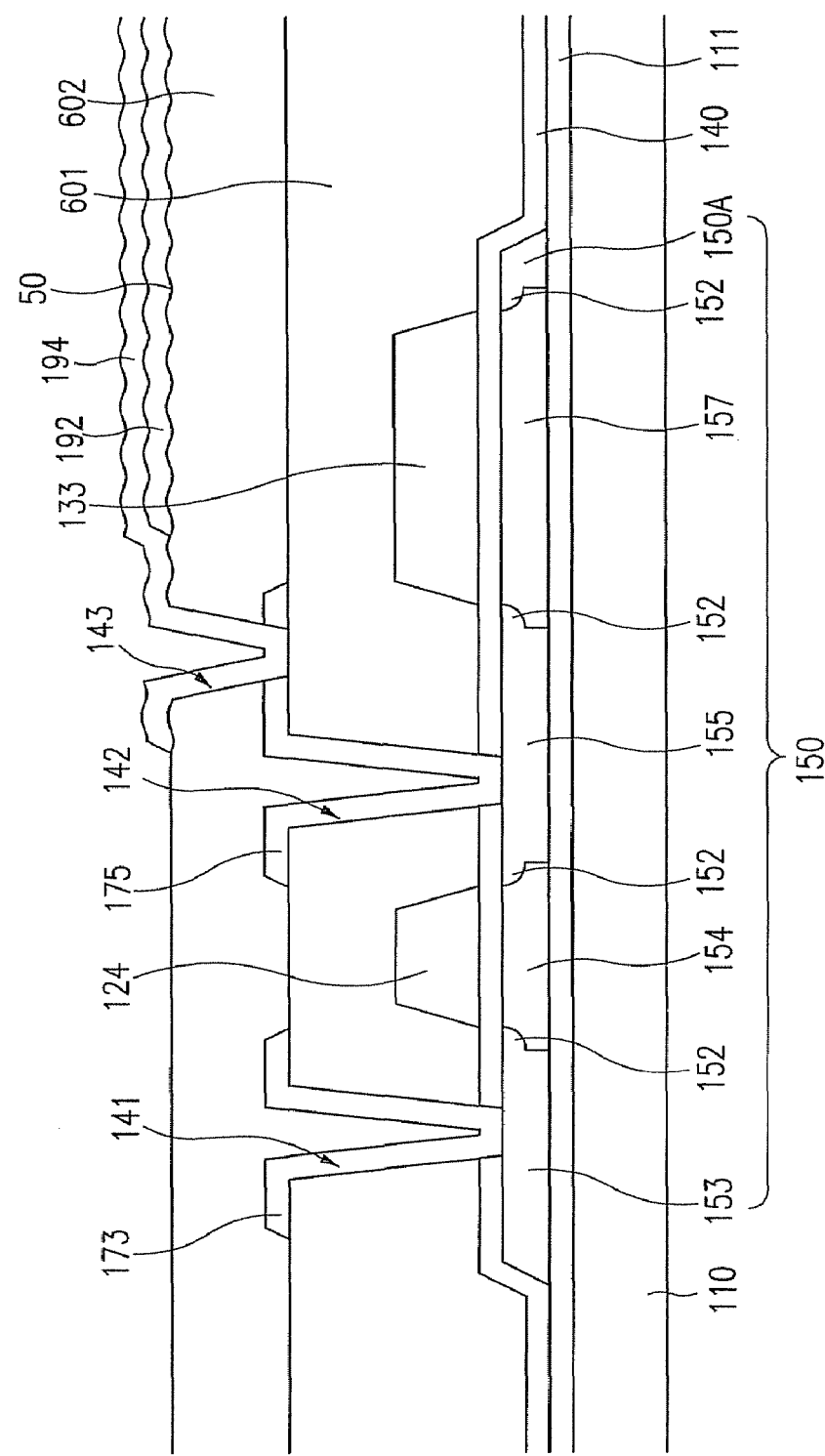
FIG. 7 is a sectional view of the LCD shown in FIG. 6 taken along the line VII-VII'.

FIG. 6 is a layout view of an LCD according to another embodiment of the present invention, and FIG. 7 is a sectional view of the LCD shown in FIG. 6 taken along the line VII-VII'.

As shown in FIGS. 6 and 7, a blocking film 111, preferably made of silicon oxide ($SiO_2$) or silicon nitride (SiNx), is formed on a transparent insulating substrate 110.

A plurality of semiconductor islands 150, preferably made of polysilicon, are formed on the blocking film 111. Each of the semiconductor islands 150 includes a plurality of extrinsic regions containing conductive impurities, which include a plurality of heavily doped regions and a plurality of lightly doped regions, and a plurality of intrinsic regions hardly containing conductive impurities. The intrinsic regions include a channel region 154 and a storage region 157, and the heavily doped regions include source and drain regions 153 and 155 separated from each other with respect to the channel region 154 and dummy regions 150A. The lightly doped regions 152 are narrow and are disposed between the intrinsic regions 154 and 157 and the heavily doped regions 153, 155, and 150A. In particular, the lightly doped regions 152 disposed between the source region 153 and the channel region 154 and between the drain region 155 and the channel region 154 are referred to as "lightly doped drain (LDD) regions."

The conductive impurities include P type impurities such as boron (B) and gallium (Ga), and N type impurities such as phosphorous (P) and arsenic (As). The lightly doped regions 152 prevent leakage current of TFTs and are substituted with offset regions that contain substantially no impurities.

A gate insulating layer 140, preferably made of silicon nitride (SiNx), is formed on the semiconductor islands 150 and the blocking film 111.

A plurality of gate conductors including a plurality of gate lines 121 and a plurality of storage electrode lines 131 are formed on a transparent insulating substrate 110.

The gate lines 121 for transmitting gate signals extend substantially in a transverse direction and include a plurality of gate electrodes 124 protruding downward to overlap the channel regions 154 of the semiconductor islands 150. The gate electrodes 124 may further overlap the lightly doped regions 152. Each gate line 121 may include an expanded end portion having a large area for contact with another layer or an external driving circuit. The gate lines 121 may be directly connected to a gate driving circuit for generating the gate signals, which may be integrated on the substrate 110.

The storage electrode lines 131 are supplied with a predetermined voltage such as a common voltage, and include a plurality of storage electrodes 133 protruding upward and downward and overlapping the storage regions 157 of the semiconductor islands 150.

The gate lines 121 and the storage electrode lines 131 may be made of Al-containing metal such as Al and an Al alloy, an Ag containing metal such as Ag and an Ag alloy, a Cu-containing metal such as Cu and a Cu alloy, a Mo-containing metal such as Mo and a Mo alloy, Cr, Ti, or Ta. The gate lines 121 and the storage electrode lines 131 may have a multilayered structure including two films having different physical characteristics. One of the films is preferably made of a low resistivity metal including an Al-containing metal for reducing signal delay or voltage drop in the gate lines 121, while the other film is preferably made of a material such as Cr, Mo, a Mo alloy such as MoW, Ta, and Ti, which have good physical, chemical, and electrical contact characteristics with other materials such as indium tin oxide (ITO) and indium zinc oxide (IZO). Good examples of combinations of the lower film material and the upper film material are a lower Cr film and an upper Al (or Al—Nd) film, and a lower Al (or Al—Nd) film and an upper Mo film.

An interlayer insulating layer 601 is formed on the gate lines 121 and the storage electrode lines 131. The interlayer insulating layer 601 is formed of double layers of $SiO_2$ and SiN. The $SiO_2$/SiN double layers improve reliability of a thin film transistor over an $SiO_2$ single layer.

The interlayer insulating layer 60s has a plurality of contact holes 141 and 142 respectively exposing the source regions 153 and the drain regions 155.

A plurality of data conductors including a plurality of data lines 171 and a plurality of drain electrodes 175 are formed on the interlayer insulating layer 601. The data lines 171 for transmitting data voltages extend substantially in the longitudinal direction and intersect the gate lines 121. Each data line 171 includes a plurality of source electrodes 173 connected to the source regions 153 through the contact holes 141. The data lines 171 may have expanded end portions for connection with a external circuit.

The drain electrodes 175 are separated from the source electrodes 173 and are connected to the drain regions 155 through the contact holes 142.

The data lines 171 and the drain electrodes 175 are made of a Mo-containing metal such as MoW that has a good chemical and electrical contact characteristics with respect to IZO (indium zinc oxide) and ITO (indium tin oxide). However, they may be made of an Ag-containing metal or an Al-containing metal or may be formed of double layers including a low resistivity film of Ag, Al, and their alloys and a good contact film of Cr, Ti, Ta, Mo, and their alloys.

An organic insulating layer 602 is formed on the data conductors 171 and 175 and the interlayer insulating layer 601.

The organic insulating layer 602 is made of an acrylic material having a dielectric constant of 3.3. JSR Co. manufactures such an acrylic material. Since the organic insulating layer 602 applied to the trans-reflective LCD having polysilicon thin film transistors includes a coupling agent, the organic insulating layer 602 has good heat-resisting characteristics. However, the coupling agent hinders the organic solution from spreading well forming the organic insulating layer 602 uniformly.

Accordingly, a surfactant for reducing surface tension is added to the organic solution for forming the organic insulating layer 602 to improve spread uniformity and speed.

Here, the organic insulating layer 602 is formed by coating an organic solution including an organic material and its solvent. It is preferable that the content ratio of is PGMEP:EEP:nBA in the solvent is 50 to 90:30 to 5:20 to 5 to reduce surface tension of the organic solution. When the content ratio of PGMEP:EEP:nBA in the solvent is 70:25:5, the organic solution has the lowest surface tension.

When the organic solution has a low surface tension, fluidity of the organic solution is good which facilitates a high spread speed and thickness uniformity.

Meanwhile, an organic insulating layer is more uniformly formed when the organic solution includes a solvent and a surfactant.

The surfactant decreases surface tension, but produces micro bubbles which have to be removed. It takes time to remove the micro bubbles, so a condition acceptable in view of both decreasing surface tension and taking less time to remove the micro bubbles must be found.

Accordingly, at least one of the silane F and the fluoric S is included in the organic solution. It is preferable that the content ratio of the silane F versus the fluoric S is 500 to 1500:50 to 500 to reduce surface tension and to diminish time for removing micro bubbles.

The organic insulating layer 602 has a plurality of contact holes 143 to expose the drain electrodes 175.

The organic insulating layer 602 has an embossed surface 50. The embossed surface 50 improves direction randomness of reflected light at a reflection electrode.

A plurality of transparent electrodes 192 made of ITO are formed on the organic insulating layer 602.

A plurality of reflection electrode 194, which are connected to the drain electrodes 175 through the contact holes 143 and made of a metal such as AlNd, are formed on the transparent electrode 192. Accordingly, a pixel electrode has a transparent electrode 192 and a reflection electrode 194.

The reflection electrode 194 has a transparent window 195 where the transparent electrode 192 is disposed. When the trans-reflective LCD is used in transparent mode, light from a back light passes through the transparent window 195 to reach a liquid crystal layer.

Henceforth, a polysilicon thin film transistor array panel for a trans-reflective LCD according to another embodiment of the present invention will be described. The polysilicon thin film transistor array panel according to this embodiment is manufactured by a method using fewer photo-etching processes.

Figure 8:
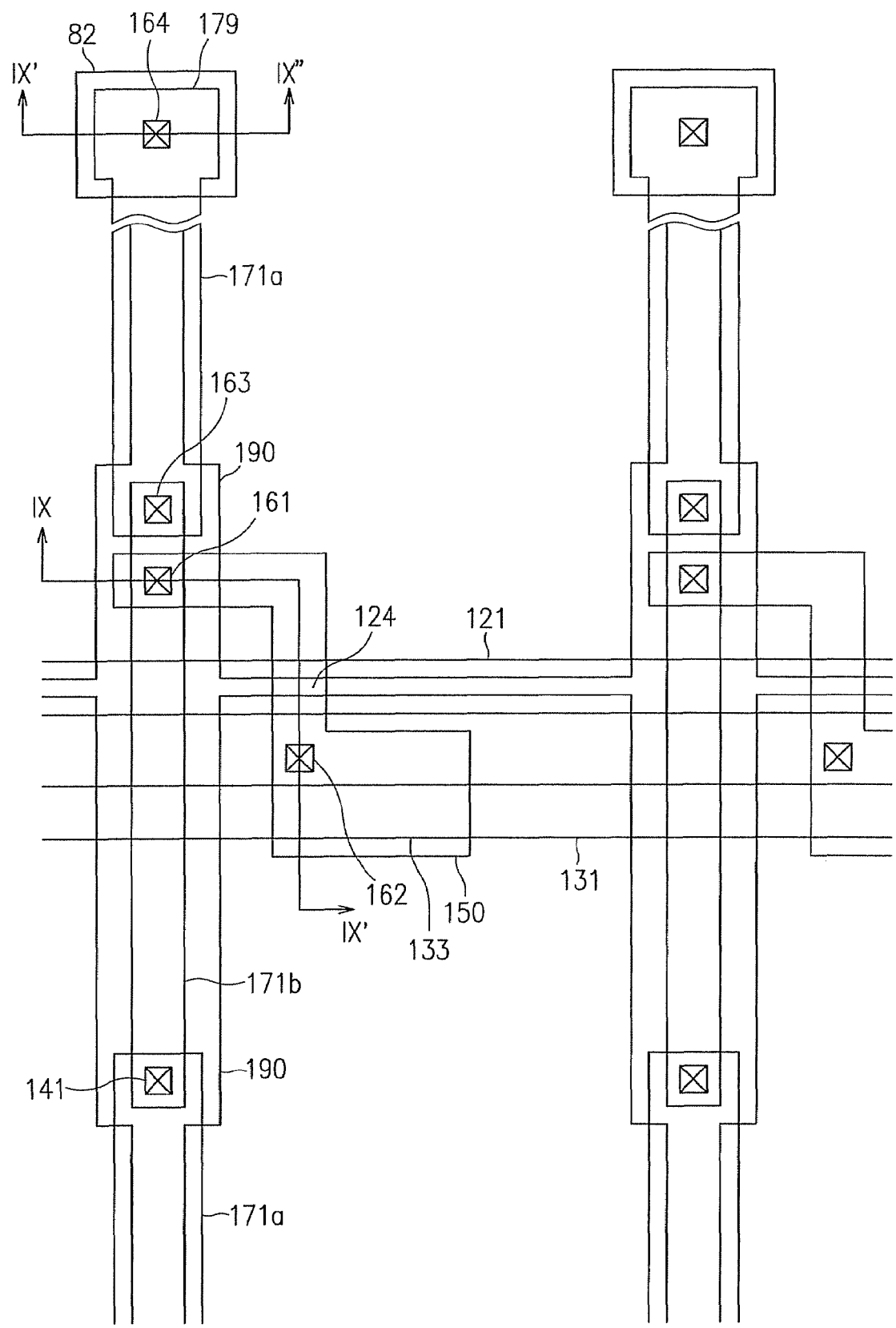
FIG. 8 is a layout view of an LCD according to another embodiment of the present invention.
Figure 9:
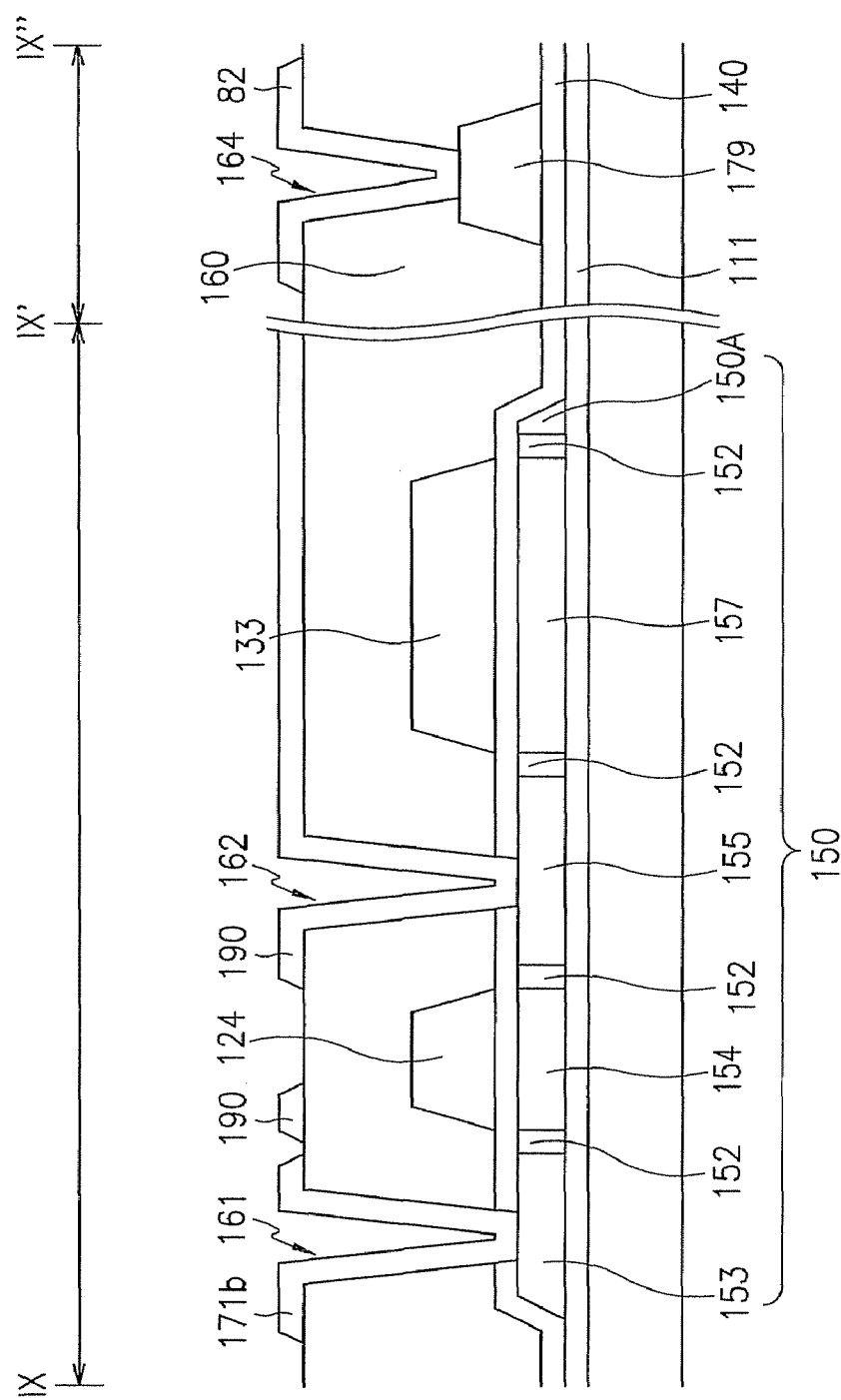
FIG. 9 is a sectional view of the LCD shown in FIG. 8 taken along the lines IX-IX' and IX'-IX''.

FIG. 8 is a layout view of an LCD according to another embodiment of the present invention. FIG. 9 is a sectional view of the LCD shown in FIG. 8 taken along the lines IX-IX' and IX'-IX".

As shown in FIGS. 8 and 9, a blocking film 111 preferably made of silicon oxide ($SiO_2$) or silicon nitride (SiNx) is formed on a transparent insulating substrate 110.

A plurality of semiconductor islands 150 preferably made of polysilicon are formed on the blocking film 111. The semiconductor islands 150 includes a source region 153, a drain region 155, and LDD regions 152.

A gate insulating layer 140 preferably made of silicon nitride (SiNx) is formed on the semiconductor islands 150 and the blocking film 111.

A plurality of gate conductors including a plurality of gate lines 121 and a plurality of storage electrode lines 131 are formed on a transparent insulating substrate 110.

The gate lines 121 for transmitting gate signals extend substantially in a transverse direction and include a plurality of gate electrodes 124 overlapping the channel regions 154 of the semiconductor islands 150.

Each gate line 121 may include an expanded end portion having a large area for contact with another layer or an external driving circuit. The gate lines 121 may be directly connected to a gate driving circuit for generating the gate signals, which may be integrated on the substrate 110.

The storage electrode lines 131 are supplied with a predetermined voltage such as a common voltage and include a plurality of storage electrodes 133 overlapping the storage regions 157 of the semiconductor islands 150.

A plurality of data line segments 171a extending in a longitudinal direction and separated from the gate lines 121 are formed as the same layer with the gate lines 121. Each data line segment 171a is disposed between two adjacent gate lines 121. However, an initiating data line segment 171a does not disposed between two adjacent gate lines 121 but disposed outer area of the first gate line 121. The initiation data line segment 171a may have an expansion 179 for connecting to an external circuit.

An organic insulating layer 160 is formed on the gate lines 121 and the storage electrode lines 131.

Here, the organic insulating layer 160 is formed by coating an organic solution including organic material and its solvent. The organic insulating layer 160 is more uniformly formed because the organic solution includes a solvent and a surfactant.

It is preferable that the content ratio of PGMEP:EEP:nBA in the solvent is 50 to 90:30 to 5:20 to 5 to reduce surface tension of the organic solution. When the content ratio of PGMEP:EEP:nBA in the solvent is 70:25:5, the organic solution has the lowest surface tension.

When the organic solution has a low surface tension, fluidity of the organic solution is good which facilitates a high spread speed and thickness uniformity.

Meanwhile, an organic insulating layer is more uniformly formed when the organic solution includes a solvent and a surfactant.

The surfactant decreases surface tension, but produces micro bubbles which have to be removed. It takes time to remove the micro bubbles, so a condition acceptable in view of both decreasing surface tension and taking less time to remove the micro bubbles.

Accordingly, at least one of the silane F and the fluoric S is included in the organic solution. It is preferable that the content ratio of the silane F versus the fluoric S is 500 to 1500:50 to 500 to reduce surface tension and to diminish time for removing micro bubbles.

A plurality of data line segments 171b pixel electrodes 190, and contact assistants 82 are formed on the organic insulating layer 160. Each data line segment 171b extends in a longitudinal direction and crosses the gate line 121 and the storage electrode line 131.

The data line segments 171b are connected to the data line segments 171a through contact holes 163 of the organic insulating layer 160, and are connected to the source regions 153 through contact holes 161. That is, the data line segments 171a are electrically connected to each other through the data line segments 171b.

The pixel electrodes 190 are connected to the drain region 155 through contact holes 162 penetrating the organic insulating layer 160 and the gate insulating layer 140. The contact assistants 82 are connected to expansions 179 of the initiating data line segments 171a through contact holes 164.

Contact assistants (not illustrated) connected to end portions of the gate lines may also be formed.

The pixel electrodes 190 are transparent electrodes allowing light from a back light to pass therethrough.

The contact assistants 82 protect the expansions 179 and complement the adhesion between the expansions 179 and external devices, and may be omitted.

The organic insulating layer according to the present invention may be applied to a trans-reflective liquid crystal display having reflection electrodes as well as transparent electrodes and polysilicon thin film transistors.

Henceforth, a polysilicon thin film transistor array panel for a trans-reflective LCD according to another embodiment of the present invention will be described.

Figure 10:
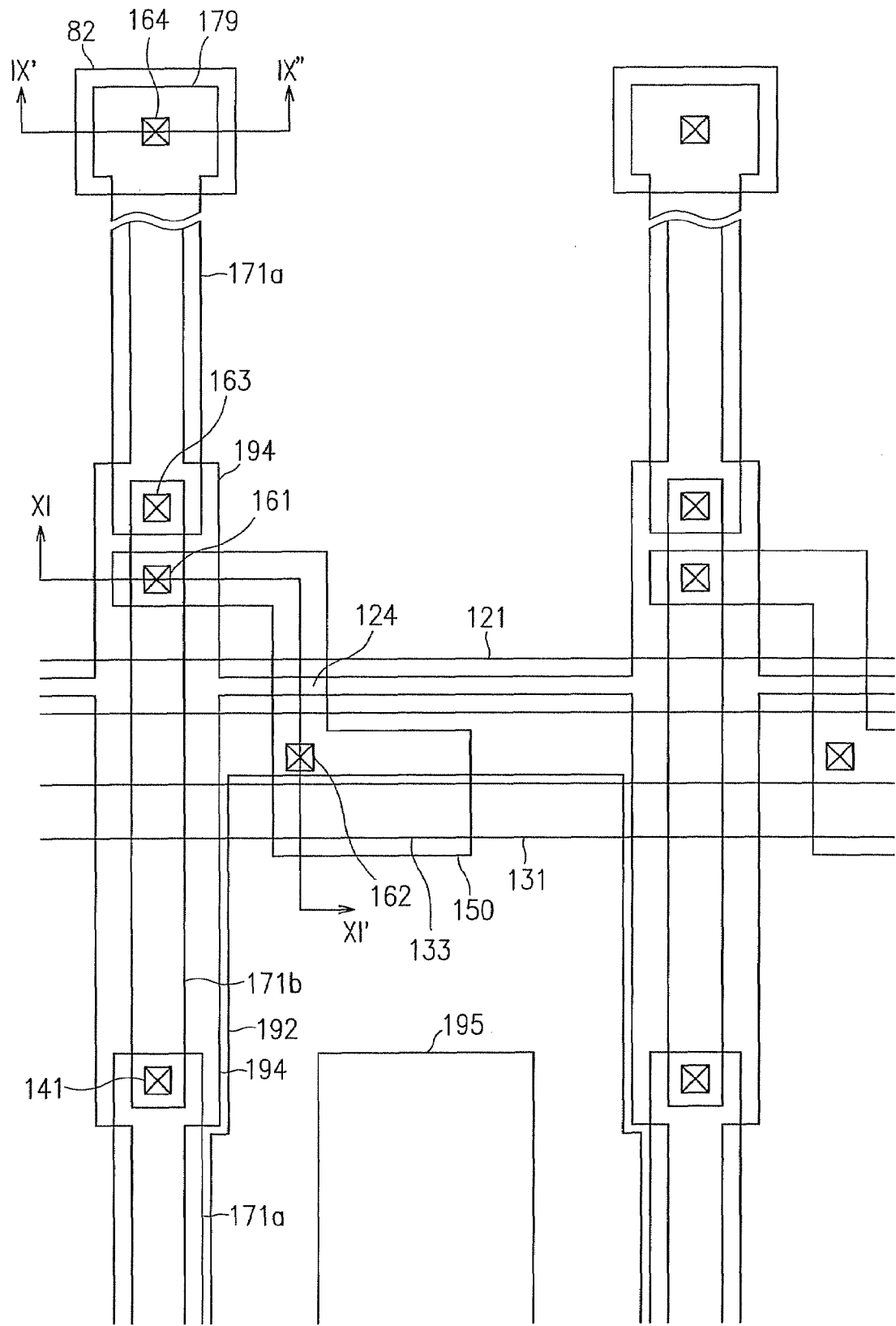
FIG. 10 is a layout view of an LCD according to another embodiment of the present invention.
Figure 11:
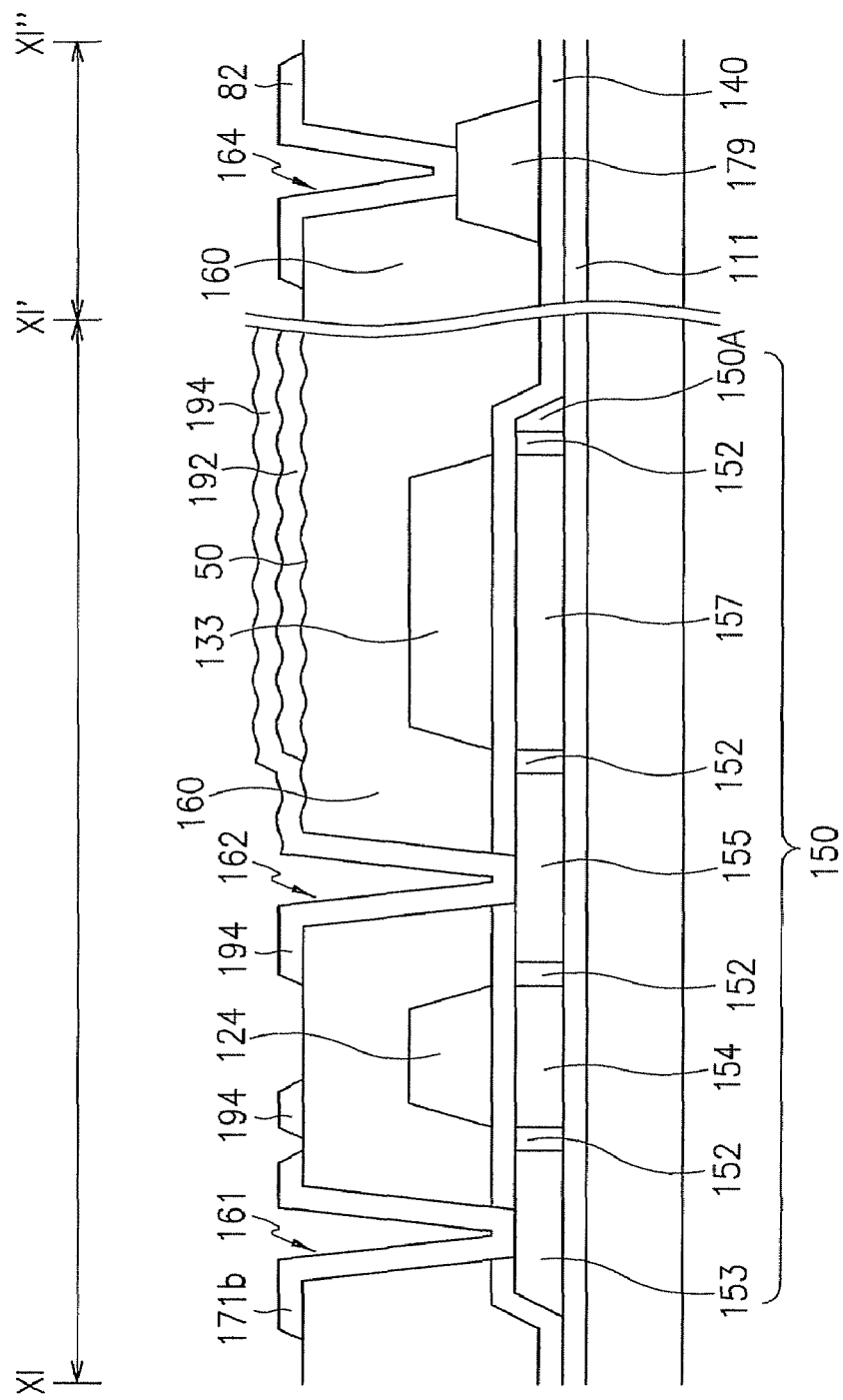
FIG. 11 is a sectional view of the LCD shown in FIG. 10 taken along the lines XI-XI' and XI'-XI''.

FIG. 10 is a layout view of an LCD according to another embodiment of the present invention. FIG. 11 is a sectional view of the LCD shown in FIG. 10 taken along the lines XI-XI' and XI'-XI".

As shown in FIGS. 10 and 11, the trans-reflective liquid crystal display has reflection electrodes 194 having transparent windows 195, transparent electrodes 192, and an organic insulating layer 160 formed under the reflection electrodes 194 and having an embossed surface 50. The embossed surface 50 improves direction randomness of reflected light at the reflection electrode.

Here, the organic insulating layer 160 is formed by coating an organic solution including an organic material and its solvent. The organic insulating layer 160 is more uniformly formed because the organic solution includes a solvent and a surfactant.

It is preferable that the content ratio of PGMEP:EEP:nBA in the solvent is 50 to 90:30 to 5:20 to 5 to reduce surface tension of the organic solution. When the content ratio of PGMEP:EEP:nBA in the solvent is 70:25:5, the organic solution has the lowest surface tension.

When the organic solution has a low surface tension, fluidity of the organic solution is good which facilitates a high spread speed and thickness uniformity.

Meanwhile, an organic insulating layer is more uniformly formed when the organic solution includes a solvent and a surfactant.

The surfactant decreases surface tension, but produces micro bubbles which have to be removed. It takes time to remove the micro bubbles, so a condition acceptable in view of both decreasing surface tension and taking less time to remove the micro bubbles must be found.

Accordingly, at least one of the silane F and the fluoric S is included in the organic solution. It is preferable that the content ratio of the silane F versus the fluoric S is 500 to 1500:50 to 500 to reduce surface tension and to diminish time for removing micro bubbles, A plurality of transparent electrodes 192 made of ITO are formed on the organic insulating layer 160.

A plurality of reflection electrodes 194, which are connected to the drain electrodes 175 through the contact holes 143 and made of a metal such as AlNd, are formed on the transparent electrode 192. Accordingly, a pixel electrode has a transparent electrode 192 and a reflection electrode 194.

The reflection electrode 194 has a transparent window 195 where the transparent electrode 192 is disposed. When the trans-reflective LCD is used in transparent mode, light from a back light passes through the transparent window 195 to reach a liquid crystal layer.

Meanwhile, when the organic insulating layer 160 includes a silane coupling agent at 1% to 10% (for trans-reflection type) or 1% to 30% (for transparent type) with respect to an amount of resin, adhesiveness of the organic insulating layer 160 to the data line segments 171a and 171b and the transparent electrode 192 is improved to prevent the organic insulating layer 160 from coming off.

Now, other embodiments of the present invention will be described.

A thin film transistor array panel according to another embodiment of the present invention will be described with reference to FIGS. 1 to 2B.

As shown in FIGS. 1 to 2B, a plurality of gate lines 121 and a plurality of storage electrode lines 131 are formed on a transparent substrate 110. The gate lines 121 and the storage electrode lines 131 are separated from each other and extend substantially in a transverse direction.

Each gate line 121 includes a plurality of portions projecting upward and downward to form a plurality of gate electrodes 124 and an expansion 129 having a large area for contact with another layer or an external device.

Each storage electrode line 131 is supplied with a predetermined voltage such as a common voltage and it includes a plurality of expansions 137 protruding upward and downward.

The gate lines 121 and the storage electrode lines 131 may be made of Al containing metal such as Al and Al alloy, Ag containing metal such as Ag and Ag alloy, Cu containing metal such as Cu and Cu alloy, Mo containing metal such as Mo and Mo alloy, Cr, Ti or Ta. The gate lines 121 and the storage electrode lines 131 may have a multilayered structure including two films having different physical characteristics. One of the films is preferably made of low resistivity metal including Al containing metal for reducing signal delay or voltage drop in the gate lines 121, while the other film is preferably made of material such as Cr, Mo, Mo alloy such as MoW, Ta and Ti, which has good physical, chemical, and electrical contact characteristics with other materials such as indium tin oxide (ITO) and indium zinc oxide (IZO). Good examples of combination of the lower film material and the upper film material are a lower Cr film and an upper Al (or Al—Nd) film and a lower Al (or Al—Nd) film and an upper Mo film.

The lateral sides of the gate lines 121 and the storage electrode lines 131 are inclined relative to a surface of the substrate 110, and the inclination angle thereof ranges about 30-80 degrees.

A gate insulating layer 140 preferably made of silicon nitride (SiNx) is formed on the gate lines 121 and storage electrode lines 131.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts stripes and islands 161 and 165 are inclined relative to a surface of the substrate 110, and the inclination angles thereof are preferably in a range of about 30-80 degrees.

A plurality of data lines 171 and a plurality of drain electrodes 175 are formed on the ohmic contacts stripes and islands 161 and 165 and the gate insulating layer 140.

The data lines 171 for transmitting data voltages extend substantially in the longitudinal direction and intersect the gate lines 121. Each data line 171 includes an expansion 179 having a larger area for contact with another layer or an external device.

A plurality of branches of each data line 171, which project toward the drain electrodes 175, form a plurality of source electrodes 173. Each drain electrode 175 includes one linear end portion disposed on a gate electrode 124 and partially enclosed by a source electrode 173 and the other expanded end portion 177 having a large area for contact with another layer and overlapping an expansion 137 of a storage electrode line 131. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 may be made of refractory metal such as Cr, Mo containing metal, Ti or Ta. However, they may also include a low resistivity film and a good contact film. Like the gate lines 121, the data lines 171 and the drain electrodes 175 have tapered lateral sides relative to the surface of the substrate 110, and the inclination angles thereof range about 30-80 degrees.

A passivation layer 180 made of an organic insulating material is formed on the data lines 171 and the drain electrodes 175, and exposed portions of the semiconductor stripes 151, which are not covered with the data lines 171 and the drain electrodes 175.

The passivation layer 180 has a plurality of contact holes 182 and 186 exposing the end portions 179 of the data lines 171 and the drain electrodes 175, respectively.

The passivation layer 180 includes 1% to 30% of a silane coupling agent (SCA) with respect to resin. The SCA is represented by the following structural formula.

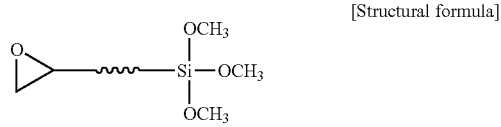

[Structural formula]

The silane functional group of the referred SCA can be substituted by an inorganic functional group to form a plurality of cross-linkings. Such cross-linkings improve adhesiveness between the passivation layer 180 and conductive layers such as the data lines 171, is the drain electrodes 175, and pixel electrodes 190 which contact the top or bottom surface of the passivation layer 180. Accordingly, a loss of adhesion of the passivation layer 180 is prevented.

Table 3 shows remaining ratio of organic insulating layers after a taping test, which were formed on a Mo/W substrate, and included 0%, 1%, 5%, and 10% of SCA, respectively.

TABLE 3

|  | Without SCA | SCA 1% | SCA 5% | SCA 10% |
|---|---|---|---|---|
| Remaining ratio (%) | 0 | 18 | 48 | 55 |

Referring to Table 3, it can be seen that the remaining ratio of an organic insulating layer on Mo/W substrate increases as the content ratio of SCA increases.

Table 4 shows remaining ratio of organic insulating layers after a taping test, which were formed on an ITO substrate and included 0%, 1%, 5%, and 10% of SCA respectively.

TABLE 4

|  | Without SCA | SCA 1% | SCA 5% | SCA 10% |
|---|---|---|---|---|
| Remaining ratio (%) | 0 | 35 | 70 | 98 |

Referring to Table 4, it can be seen that the remaining ratio of an organic insulating layer on an ITO substrate increases as the content ratio of SCA increases.

Accordingly, when the passivation layer 180 include 1% to 30% of a silane coupling agent with respect to resin, adhesiveness of the passivation layer 180 to the data line 171 and the pixel electrode 190 is improved to prevent the passivation layer 180 from coming off.

A plurality of pixel electrodes 190 and a plurality of contact assistants 82, which are made a transparent conductive material such as ITO and IZO, are formed on the passivation layer 180.

A thin film transistor having transparent pixel electrodes is used for a transparent LCD.

The pixel electrodes 190 are physically and electrically connected to the drain electrodes 175 through the contact holes 186 such that the pixel electrodes 190 receive the data voltages from the drain electrodes 175.

The pixel electrodes 190 supplied with the data voltages generate electric fields in cooperation with a common electrode on the upper panel (not illustrated), which reorient liquid crystal molecules in a liquid crystal layer (not illustrated) disposed therebetween.

The pixel electrode 190 and the common electrode form a liquid crystal capacitor to preserve applied voltage after turning off the thin film transistor. A storage capacitor connected to the liquid crystal capacitor in parallel is formed to enhance capability of preserving a pixel voltage. The storage capacitance may be formed by overlapping of the pixel electrode 190 and the storage electrode line 132 or by overlapping of the pixel electrode 190 and a previous gate line.

To increase storage capacitance, the storage electrode line 131 has expansions 137 to increase the overlapping area, and the expansion 177 of the drain electrode 175 is disposed to overlap the expansion 137 of the storage electrode line 131 to decrease the distance between the two electrodes forming the storage capacitor.

The contact assistants 82 are connected to the exposed expansions 179 of the data lines 171 through the contact holes 182. The contact assistants 82 protect the exposed portions 179 and complement the adhesion between the exposed portions 179 and external devices, and they may be omitted.

The gate line 121 includes an expansion 129 having a larger area for contact with another layer or an external device.

The passivation layer 180 has a plurality of contact holes 181 exposing the expansions 129 of the gate lines 121.

A plurality of contact assistant 81, which are made of a transparent conductive material such as ITO and IZO, are formed on the passivation layer 180 to be connected with the expansions 129 of the gate lines 121 through the contact holes 181.

Such contact assistants 81 are needed when the gate driving circuit is installed on the thin film transistor array panel or on the flexible printed circuit as a chip. However, when the gate driving circuit is directly fabricated on the thin film transistor array panel, the contact assistants 81 and the contact holes may be omitted.

The organic insulating layer according to the previous embodiment may be applied to a trans-reflective liquid crystal display having reflection electrodes as well as transparent electrodes.

The trans-reflective liquid crystal display has reflection electrodes having transparent windows, transparent electrodes, and an organic insulating layer formed under the reflection electrodes and having an embossed surface. The embossed surface improves direction randomness of reflected light at the reflection electrode.

The passivation layer 180 includes 1% to 10% of a silane coupling agent (SCA) with respect to an amount of included resin. The SCA is represented by the following structural formula.

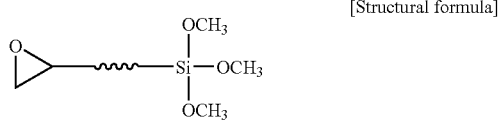

[Structural formula]

Henceforth, the function of SCA included in the passivation layer 180 will be described with reference to FIGS. 12A to 12C.

Figure 12A:
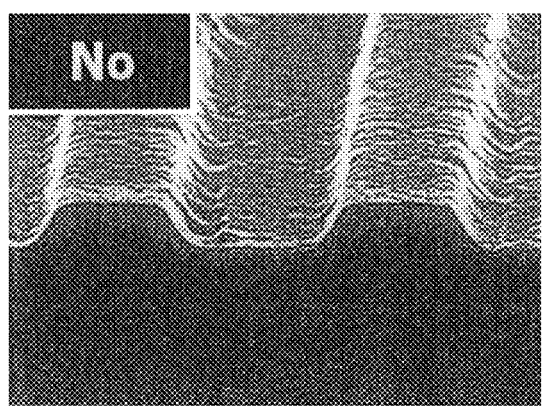
Figure 12A:
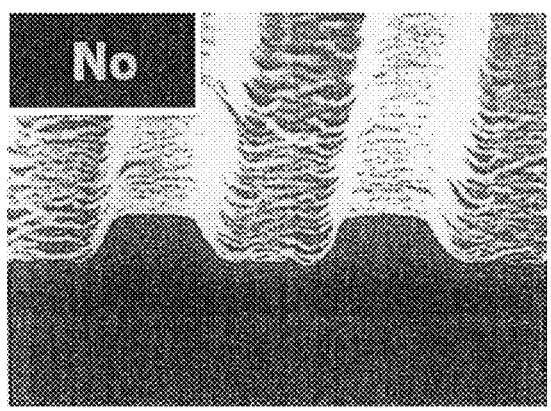
Figure 12A:
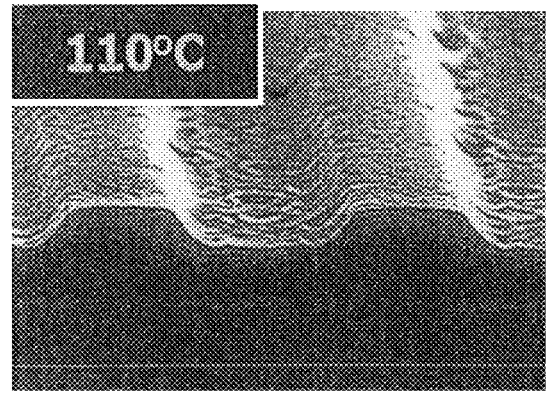
Figure 12A:
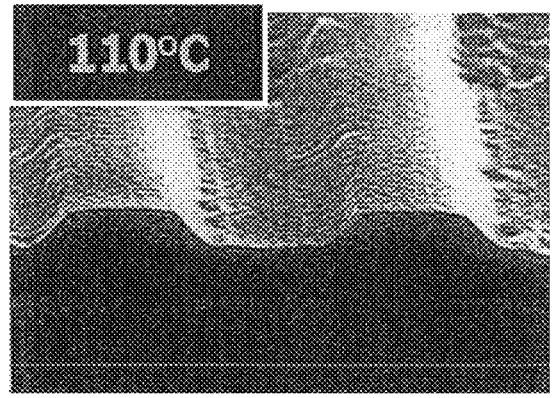
Figure 12A:
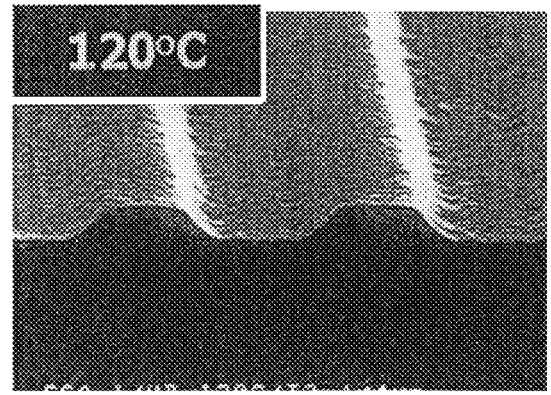
Figure 12A:
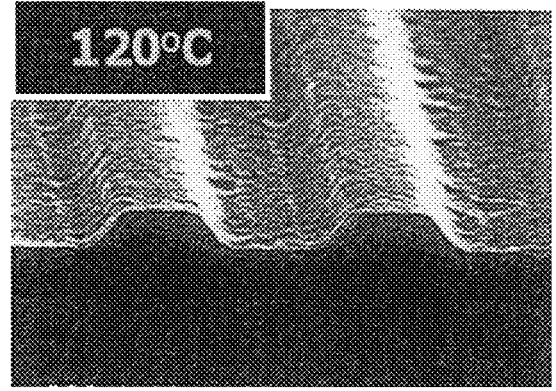
Figure 12B:
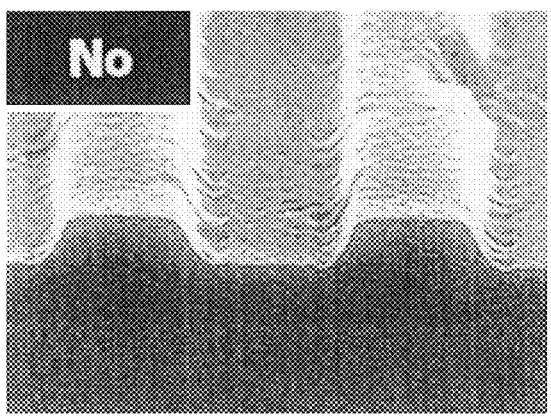
Figure 12B:
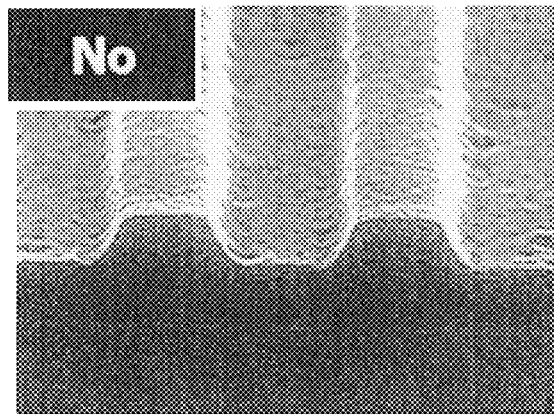
Figure 12B:
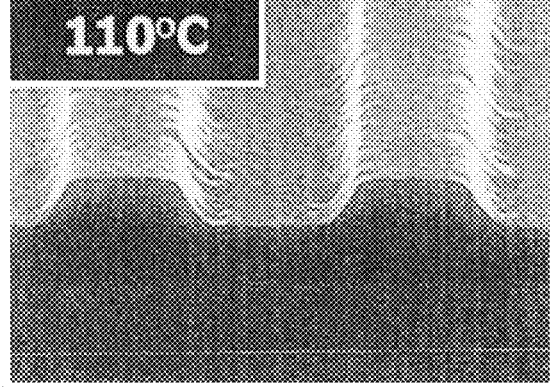
Figure 12B:
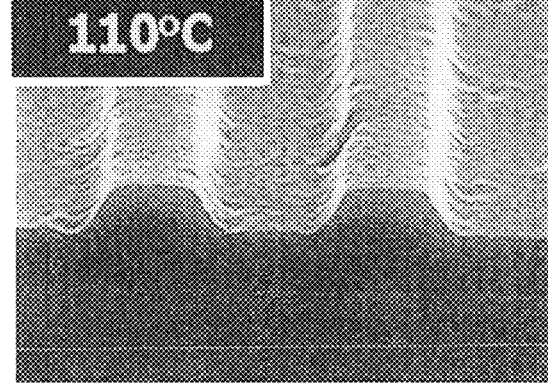
Figure 12B:
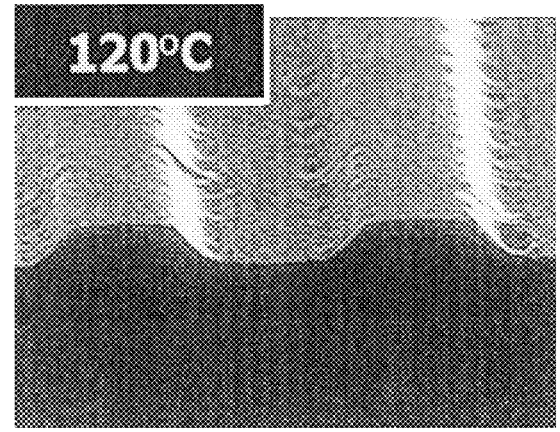
Figure 12B:
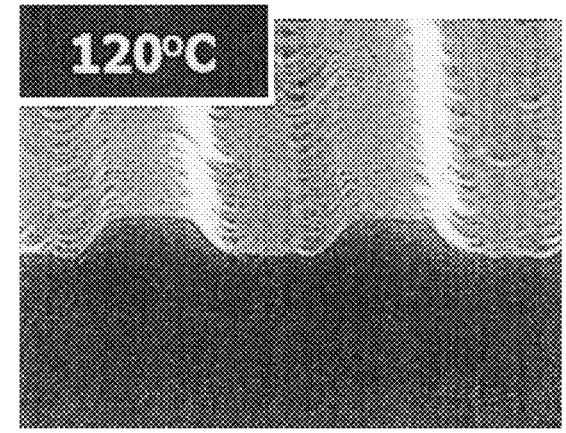

FIGS. 12A to 12C are pictures of edges of organic insulating layers formed according to embodiments of the present invention to compare adhesiveness and strength with respect to heat.

The silane functional group of the referred SCA can be substituted by an inorganic functional group to form a plurality of cross-linkings. Such cross-linkings improve adhesiveness between the passivation layer 180 and conductive layers, such as the data lines 171, the drain electrodes 175, and the pixel electrodes 190, contacting the top or bottom surface of the passivation layer 180. Accordingly, loss of adhesion of the passivation layer 180 is prevented.

However, since the SCA includes silicon (Si), it plays a role of a plasticizer as well as an adhesion agent. Therefore, when the content of the SCA is too high in the passivation layer 180, heat resisting characteristics of the passivation layer 180 may be degraded due to plasticizing. In other words, when too much SCA is present in the passivation layer 180, some SCA molecules cannot form the cross-linking and cannot contribute to improving adhesiveness. The SCA molecules which cannot form the cross-linking increase the free volume in the passivation layer 180 and encourage chain slimming and spinning of the main chain of the amorphous polymer. Accordingly, the passivation layer 180 is plasticized to degrade its heat resisting characteristics.

When the passivation layer 180 includes SCA at over 15% with respect to included resin, the heat resisting characteristics of the passivation layer 180 are degraded too much by the plasticizing. This results in crushing of protrusions that form embossed surfaces 50. Accordingly, the effect of the embossed surface 50 disappears.

Therefore, as shown in FIGS. 12a to 12b it is preferable that the passivation layer 180 includes SCA at 1% to 10% with respect to resin.

The organic insulating layer according to the previous embodiment may be applied to a polysilicon thin film transistor array panel.

Henceforth, a thin film transistor array panel of polysilicon according to another embodiment of the present invention will be described with respect to FIGS. 4 and 5.

As shown in FIGS. 4 and 5, a blocking film 111 preferably made of silicon oxide ($SiO_2$) or silicon nitride ($SiN_x$) is formed on a transparent insulating substrate 110.

A plurality of semiconductor islands 150, preferably made of polysilicon, are formed on the blocking film 111. Each of the semiconductor islands 150 includes a plurality of extrinsic regions containing conductive impurities, which include a plurality of heavily doped regions and a plurality of lightly doped regions, and a plurality of intrinsic regions hardly containing conductive impurities. The intrinsic regions include a channel region 154 and a storage region 157, and the heavily doped regions include source and drain regions 153 and 155 separated from each other with respect to the channel region 154 and dummy regions 150A. The lightly doped regions 152 are narrow and are disposed between the intrinsic regions 154 and 157 and the heavily doped regions 153, 155, and 150A. In particular, the lightly doped regions 152 disposed between the source region 153 and the channel region 154 and between the drain region 155 and the channel region 154 are referred to as "lightly doped drain (LDD) regions."

The conductive impurities include P type impurities such as boron (B) and gallium (Ga), and N type impurities such as phosphorous (P) and arsenic (As). The lightly doped regions 152 prevent leakage current of TFTs and are substituted with offset regions that contain substantially no impurities.

A gate insulating layer 140, preferably made of silicon nitride (SiNx), is formed on the semiconductor islands 150 and the blocking film 111.

A plurality of gate conductors including a plurality of gate lines 121 and a plurality of storage electrode lines 131 are formed on a transparent insulating substrate 110.

The gate lines 121 for transmitting gate signals extend substantially in a transverse direction, and include a plurality of gate electrodes 124 protruding downward to overlap the channel regions 154 of the semiconductor islands 150. The gate electrodes 124 may further overlap the lightly doped regions 152. Each gate line 121 may include an expanded end portion having a large area for contact with another layer or an external driving circuit. The gate lines 121 may be directly connected to a gate driving circuit for generating the gate signals, which may be integrated on the substrate 110.

The storage electrode lines 131 are supplied with a predetermined voltage such as a common voltage, and include a plurality of storage electrodes 133 protruding upward and downward and overlapping the storage regions 157 of the semiconductor islands 150.

The gate lines 121 and the storage electrode lines 131 may be made of an Al-containing metal such as Al and an Al alloy, an Ag-containing metal such as Ag and an Ag alloy, a Cu-containing metal such as Cu and a Cu alloy, a Mo-containing metal such as Mo and a Mo alloy, Cr, Ti, or Ta. The gate lines 121 and the storage electrode lines 131 may have a multilayered structure including two films having different physical characteristics. One of the films is preferably made of a low resistivity metal including an Al-containing metal for reducing signal delay or voltage drop in the gate lines 121, while the other film is preferably made of a material such as Cr, Mo, a Mo alloy such as MoW, Ta, and Ti, which have good physical, chemical, and electrical contact characteristics with other materials such as indium tin oxide (ITO) and indium zinc oxide (IZO). Good examples of combinations of the lower film material and the upper film material are a lower Cr film and an upper Al (or Al—Nd) film, and a lower Al (or Al—Nd) film and an upper Mo film.

An interlayer insulating layer 601 is formed on the gate lines 121 and the storage electrode lines 131. The interlayer insulating layer 601 is formed of double layers of SiO$_2$ and SiN. The SiO$_2$/SiN double layers improve reliability of a thin film transistor over an SiO$_2$ single layer.

The interlayer insulating layer 601 has a plurality of contact holes 141 and 142 respectively exposing the source regions 153 and the drain regions 155.

A plurality of data conductors including a plurality of data lines 171 and a plurality of drain electrodes 175 are formed on the interlayer insulating layer 601. The data lines 171 for transmitting data voltages extend substantially in the longitudinal direction and intersect the gate lines 121. Each data line 171 includes a plurality of source electrodes 173 connected to the source regions 153 through the contact holes 141. The data lines 171 may have expanded end portions for connection with an external circuit.

The drain electrodes 175 are separated from the source electrodes 173 and are is connected to the drain regions 155 through the contact holes 142.

The data lines 171 and the drain electrodes 175 are made of a Mo-containing metal such as MoW that has good chemical and electrical contact characteristics with respect to IZO (indium zinc oxide) and ITO (indium tin oxide). However, they may be made of an Ag-containing metal or an Al-containing metal or may be formed of double layers including a low resistivity film of Ag, Al, and their alloys and a good contact film of Cr, Ti, Ta, Mo, and their alloys.

An organic insulating layer 602 is formed on the data conductors 171 and 175 and the interlayer insulating layer 601.

The organic insulating layer 602 includes 1% to 30% of a silane coupling agent (SCA) with respect to resin. The SCA is represented by the following structural formula.

[Structural formula]

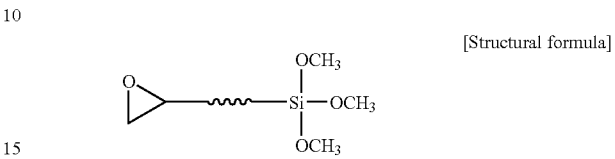

The silane functional group of the SCA can be substituted by an inorganic functional group to form a plurality of cross-linkings. Such cross-linkings improve adhesiveness between the organic insulating layer 602 and conductive layers such as the data lines 171, the drain electrodes 175, and pixel electrodes 190, which contact the top or bottom surface of the organic insulating layer 602. Accordingly, loss of adhesion of the passivation layer 180 is prevented.

The organic insulating layer 602 has a plurality of contact holes 143 to expose the drain electrodes 175.

A plurality of transparent electrodes 192, which are pixel electrodes and are made of ITO, are formed on the organic insulating layer 602.

The organic insulating layer according to the present invention may be applied to a trans-reflective liquid crystal display having reflection electrodes as well as transparent electrodes and polysilicon thin film transistors.

Henceforth, a polysilicon thin film transistor array panel for a trans-reflective LCD according to another embodiment of the present invention will be described with reference to FIGS. 6 and 7.

As shown in FIGS. 6 and 7, an organic insulating layer 602 is formed on the data line 171, the drain electrode 175, and the interlayer insulating layer 601.

The organic insulating layer 602 has an embossed surface 50. The embossed surface 50 improves direction randomness of reflected light at a reflection electrode.

The organic insulating layer 602 includes 1% to 10% of a silane coupling agent (SCA) with respect to included resin.

The silane functional group of the SCA can be substituted by an inorganic functional group to form a plurality of cross-linkings. Such cross-linkings improve adhesiveness between the organic insulating layer 602 and conductive layers, such as the data lines 171, the drain electrodes 175, and pixel electrodes 190, contacting the top or bottom surface of the organic insulating layer 602. Accordingly, loss of adhesion of the organic insulating layer 602 is prevented.

When the organic insulating layer 602 includes SCA at over 15% with respect to included resin, the heat resisting characteristics of the organic insulating layer 602 is degraded too much by the plasticizing. This results in crushing protrusions that form embossed surface 50 as shown in FIG. 12C. Accordingly, the effect of embossed surface 50 disappears.

Therefore, as shown in FIGS. 12a to 12b, it is preferable that the organic insulating layer 602 includes SCA at 1% to 10% with respect to resin.

A plurality of transparent electrodes 192, which are pixel electrodes and are made of ITO, are formed on the organic insulating layer 602.

A plurality of reflection electrodes 194, which are connected to the drain electrodes 175 through the contact holes 143 and made of a metal such as AlNd, are formed on the transparent electrode 192. Accordingly, a pixel electrode has a transparent electrode 192 and a reflection electrode 194.

The reflection electrode 194 has a transparent window 195 where the transparent electrode 192 is disposed. When the trans-reflective LCD is used in transparent mode, light from a back light passes through the transparent window 195 to reach a liquid crystal layer.

Henceforth, a polysilicon thin film transistor array panel for a trans-reflective LCD according to another embodiment of the present invention will be described with reference to FIGS. 8 and 9. The polysilicon thin film transistor array panel according to this embodiment is manufactured by a method using fewer photo-etching processes.

As shown in FIGS. 8 and 9, a blocking film 111 preferably made of silicon oxide (SiO$_2$) or silicon nitride (SiNx) is formed on a transparent insulating substrate 110.

A plurality of semiconductor islands 150 preferably made of polysilicon are formed on the blocking film 111. The semiconductor islands 150 includes a source region 153, a drain region 155, and LDD regions 152.

A gate insulating layer 140 preferably made of silicon nitride (SiNx) is formed on the semiconductor islands 150 and the blocking film 111.

A plurality of gate conductors including a plurality of gate lines 121 and a plurality of storage electrode lines 131 are formed on a transparent insulating substrate 110.

The gate lines 121 for transmitting gate signals extend substantially in a transverse direction and include a plurality of gate electrodes 124 overlapping the channel regions 154 of the semiconductor islands 150.

Each gate line 121 may include an expanded end portion having a large area for contact with another layer or an external driving circuit. The gate lines 121 may be directly connected to a gate driving circuit for generating the gate signals, which may be integrated on the substrate 110.

The storage electrode lines 131 are supplied with a predetermined voltage such as a common voltage and include a plurality of storage electrodes 133 overlapping the storage regions 157 of the semiconductor islands 150.

A plurality of data line segments 171a extending in a longitudinal direction and separated from the gate lines 121 are formed as the same layer with the gate lines 121. Each data line segment 171a is disposed between two adjacent gate lines 121. However, an initiating data line segment 171a does not disposed between two adjacent gate lines 121 but disposed outer area of the first gate line 121. The initiation data line segment 171a may have a expansion 179 for connecting to an external circuit.

An organic insulating layer 160 is formed on the gate lines 121 and the storage electrode lines 131.

The organic insulating layer 160 includes 1% to 30% of a silane coupling agent (SCA) with respect to resin. The SCA is represented by the following structural formula.

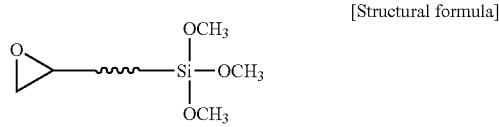

[Structural formula]

The silane functional group of the SCA can be substituted by an inorganic functional group to form a plurality of cross-linkings. Such cross-linkings improve adhesiveness between the organic insulating layer 160 and conductive layers such as the data lines 171, the drain electrodes 175, and pixel electrodes 190, which contact the top or bottom surface of the organic insulating layer 160. Accordingly, a loss of adhesion of the passivation layer 180 is prevented.

A plurality of data line segments 171b, pixel electrodes 190, and contact assistants 82 are formed on the organic insulating layer 160. Each data line segment 171b extends in a longitudinal direction and crosses the gate line 121 and the storage electrode line 131.

The data line segments 171b are connected to the data line segments 171a through contact holes 163 of the organic insulating layer 160 and are connected to the source regions 153 through contact holes 161. That is, the data line segments 171a are electrically connected to each other through the data line segments 171b.

The pixel electrodes 190 are connected to the drain region 155 through contact holes 162 penetrating the organic insulating layer 160 and the gate insulating layer 140. The contact assistants 82 are connected to expansions 179 of the initiating data line segments 171a through contact holes 164.

Contact assistants (not illustrated) connected to end portions of the gate lines may also be formed.

The pixel electrodes 190 are transparent electrodes allowing light from a back light to pass therethrough.

The contact assistants 82 protect the expansions 179 and complement the adhesion between the expansions 179 and external devices, and may be omitted.

The organic insulating layer according to the present invention may be applied to a trans-reflective liquid crystal display having reflection electrodes as well as transparent electrodes and polysilicon thin film transistors.

Henceforth, a polysilicon thin film transistor array panel for a trans-reflective LCD according to another embodiment of the present invention will be described with reference to FIGS. 10 and 11.

As shown in FIGS. 10 and 11, the organic insulating layer 160 has an embossed surface 50. The embossed surface 50 improves direction randomness of reflected light at a reflection electrode.

The organic insulating layer 160 includes 1% to 10% of a silane coupling agent (SCA) with respect to included resin.

The silane functional group of the referred SCA can be substituted by an inorganic functional group to form a plurality of cross-linkings. Such cross-linkings improve adhesiveness between the organic insulating layer 160 and conductive layers, such as the data lines 171, the drain electrodes 175, and pixel electrodes 190, contacting the top or bottom surface of the organic insulating layer 160. Accordingly, loss of adhesion of the organic insulating layer 160 is prevented.

When the organic insulating layer 160 includes SCA at over 15% with respect to included resin, the heat resisting characteristics of the organic insulating layer 160 are excessively degraded by the plasticizing. This results in crushing protrusions that form the embossed surface 50 as shown in FIG. 12C. Accordingly, the effect of the embossed surface 50 disappears.

Therefore, as shown in FIGS. 12a to 12b it is preferable that the organic insulating layer 160 includes SCA at 1% to 10% with respect to resin.

A plurality of transparent electrodes 192, which are pixel electrodes and are made of ITO, are formed on the organic insulating layer 160.

A plurality of reflection electrodes 194, which are connected to the drain electrodes 175 through the contact holes 143 and made of a metal such as AlNd, are formed on the transparent electrode 192. Accordingly, a pixel electrode has a transparent electrode 192 and a reflection electrode 194.

The reflection electrode 194 has a transparent window 195 where the transparent electrode 192 is disposed. When the trans-reflective LCD is used in transparent mode, light from a back light passes through the transparent window 195 to reach a liquid crystal layer.

In the present invention, an organic insulating layer is formed by using a solvent including PGMEP, EEP (ethoxy ethyl propionate), and nBA (n-butylacetate) and a surfactant to improve thickness uniformity and to prevent the organic insulating layer from inducing spots.

An organic insulating layer is formed to include a silane coupling agent (SCA) at 1% to 10% (for trans-reflection type) or 1% to 30% (for transparent type) with respect to included resin.

The SCA enhances adhesiveness of the organic insulating layer to the data line and the transparent electrode to prevent the organic insulating layer from coming off.

Accordingly, productivity and characteristics of a thin film transistor array panel are improved.

Although the illustrative embodiments have been described herein with reference to the accompanying drawings, it is to be understood that the present invention is not limited to those precise embodiments, and that various changes and modifications may be affected therein by one of ordinary skill in the related art without departing from the scope or spirit of the invention. All such changes and modifications are intended to be included within the scope of the invention as defined by the appended claims.

What is claimed is:

1. A method of manufacturing a thin film transistor array panel, the method comprising:
    forming a first signal line on an insulating substrate, the first signal line extending in a first direction;
    forming a second signal line on the insulating substrate, the second signal line extending in a second direction, and intersecting the first signal line;
    connecting a thin film transistor to the first and second signal lines;
    forming a passivation layer on the second signal line, the passivation layer having a contact hole exposing a portion of the second signal line; and
    forming a pixel electrode on the passivation layer and connected to the thin film transistor through the contact hole,
    wherein the forming the passivation layer includes coating an organic solution that includes an organic insulating material and a solvent including PGMEP, EEP, and nBA.

2. The method of claim 1, wherein the content ratio of PGMEP:EEP:nBA in the solvent is 50 to 90:30 to 5:20 to 5.

3. The method of claim 1, wherein the organic solution further includes a surfactant comprising at least one of silane F and fluoric S.

4. The method of claim 3, wherein the content ratio of silane F:fluoric S in the surfactant is 500 to 1500:50 to 500.

5. A method of manufacturing a thin film transistor array panel, the method comprising:
    forming a gate line on an insulating substrate;
    forming a gate insulating layer on the gate line;
    forming a semiconductor layer on the gate insulating layer;
    forming a data line on the semiconductor layer;
    forming a passivation layer on the data line, the passivation layer having a contact hole exposing a portion of the data line; and
    forming a pixel electrode on the passivation layer and connecting the pixel electrode to the exposed portion of the data line through the contact hole,
    wherein the forming the passivation layer includes coating an organic solution that includes an organic insulating material and a solvent including PGMEP, EEP, and nBA.

6. The method of claim 5, wherein the content ratio of PGMEP:EEP:nBA in the solvent is 50 to 90:30 to 5:20 to 5.

7. The method of claim 5, wherein the organic solution further includes a surfactant comprising at least one of silane F and fluoric S.

8. The method of claim 7, wherein the content ratio of silane F:fluoric S in the surfactant is 500 to 1500:50 to 500.

* * * * *